United States Patent
Hasegawa et al.

(10) Patent No.: US 6,387,548 B1
(45) Date of Patent: May 14, 2002

(54) EXCHANGE COUPLING FILM AND MAGNETORESISTANCE EFFECT TYPE ELEMENT USING THIS EXCHANGE COUPLING FILM, AND THIN FILM MAGNETIC HEAD USING THE MAGNETORESISTANCE EFFECT TYPE ELEMENT

(75) Inventors: Naoya Hasegawa; Masamichi Saito; Kazuya Oominato; Yutaka Yamamoto; Akihiro Makino, all of Niigata-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 0 days.

(21) Appl. No.: 09/168,775

(22) Filed: Oct. 8, 1998

(30) Foreign Application Priority Data

Oct. 22, 1997 (JP) .................................. 9-309406
Aug. 24, 1998 (JP) .................................. 10-236801

(51) Int. Cl.[7] .................................................. G11B 5/66
(52) U.S. Cl. ............... 428/692; 428/694 R; 428/694 T; 428/694 TS; 428/694 TM; 428/694 EC; 428/900; 360/113; 324/252
(58) Field of Search ...................... 428/694 T, 694 TS, 428/694 TM, 694 R, 692, 900; 360/113; 324/252

(56) References Cited

U.S. PATENT DOCUMENTS

| 5,159,513 A | 10/1992 | Dieny et al. .............. 360/324.1 |
| 5,206,590 A | 4/1993 | Dieny et al. ................. 324/252 |
| 5,373,238 A | 12/1994 | McGuire et al. ............. 324/252 |
| 5,691,864 A | 11/1997 | Saito ...................... 360/327.32 |
| 5,768,067 A | 6/1998 | Saito et al. ............ 360/327.32 |
| 5,784,225 A | 7/1998 | Saito et al. .............. 29/603.14 |
| 5,976,713 A | * 11/1999 | Fuke ........................... 428/692 |

OTHER PUBLICATIONS

Bunsen Y Wong et al., Structural Origin of Magnetic Biased Field in NiMn/NiFe Exchange Coupled Films, May 15, 1996.

* cited by examiner

Primary Examiner—Leszek Kiliman
(74) Attorney, Agent, or Firm—Brinks Hofer Gilson & Lione

(57) ABSTRACT

The antiferromagnetic layer 4 is formed of the X—Mn alloy (X is an platinum group element) and the interface structure of with the pinned magnetic layer 3 is made to be non-coherent by properly adjusting the composition ratio of X. Consequently, the crystal structure of the antiferromagnetic layer 4 is transformed so as to obtain a large exchange anisotropic magnetic field by subjecting the layer to a heat treatment, making it possible to improve the reproduction characteristic over the conventional art.

103 Claims, 10 Drawing Sheets

EXCHANGE COUPLING FILM AND MAGNETORESISTANCE EFFECT TYPE ELEMENT USING THIS EXCHANGE COUPLING FILM, AND THIN FILM MAGNETIC HEAD USING THE MAGNETORESISTANCE EFFECT TYPE ELEMENT

BACKGROUND OF THE INVENTION

1. Field of the Invention

The present invention relates to an exchange coupling film composed of an antiferromagnetic layer and a ferromagnetic layer, the magnetization direction of the antiferromagnetic layer being fixed along a prescribed direction due to an exchange anisotropic magnetic field generated at the interface between the antiferromagnetic layer and ferromagnetic layer. Especially, the present invention relates to an exchange coupling film being allowed to obtain a larger exchange anisotropic magnetic field when the antiferromagnetic layer is formed of an antiferromagnetic material containing an element X (for example, Pt or Pd) and Mn, and to a magnetoresistive element (spin-valve type thin film element; AMR (anisotropic magnetoresistive) element) using this exchange coupling film.

2. Description of the Related Art

The spin-valve type thin film element belongs to one of GMR (giant magnetoresistive) elements making use of a giant magnetoresistance effect for sensing recording magnetic field from a recording medium such as a hard disk unit.

This spin-valve type thin film element has a relatively simple construction among the GMR elements along with having some features that its resistance can be varied under a weak magnetic field.

The spin-valve type thin film element described above has a most simple construction composed of an antiferromagnetic layer, a pinned magnetic layer, a non-magnetic conductive layer and a free magnetic layer.

The antiferromagnetic layer is formed in direct contact with the pinned magnetic layer and the magnetization direction of the pinned magnetic layer is fixed along a prescribed direction forming a single magnetic domain due to the exchange anisotropic magnetic field generated at the interface between the antiferromagnetic layer and pinned magnetic layer.

Magnetization of the free magnetic layer is aligned along the direction to cross with the magnetization direction of the pinned magnetic layer by being affected by bias layers formed at both sides of the free magnetic layer.

Usually, a film of a Fe—Mn (iron-manganese) alloy or Ni—Mn (nickel-manganese) alloy is used for the antiferromagnetic layer, a film of a Ni—Fe (nickel-iron) alloy is used for the pinned magnetic layer and free magnetic layer, a Cu (copper) film is used for the non-magnetic conductive layer 3 and a film of a Co—Pt (cobalt-platinum) alloy is used for the bias layer.

In this spin-valve type thin film element, electric resistance is changed depending on the direction of the pinned magnetic field of the pinned magnetic layer related to variation of the magnetization direction of the free magnetic field caused by leakage magnetic field from the magnetic medium such as a hard disk unit. The leakage magnetic field can be thus sensed from voltage changes ascribed to this electric resistance changes.

Although the films of the Fe—Mn alloy or Ni—Mn alloys are used for the antiferromagnetic layer as described above, the film of the Fe—Mn alloy has drawbacks of low corrosion resistance, small exchange anisotropic magnetic field and a blocking temperature as low as about 150° C. Low blocking temperature causes a problem that the exchange anisotropic magnetic field is quenched by the temperature increase of the element during the manufacturing process of the head or in the head under operation.

The film of the Ni—Mn alloy has, on the contrary, a relatively large exchange anisotropic magnetic field as well as a blocking temperature of as high as about 300° C. Therefore, it is preferable to use the film of the Ni—Mn alloy rather than using the film of the Fe—Mn alloy for the antiferromagnetic layer.

B. Y. Wong, C. Mitsumata, S. Prakash, D. E. Laughlin and T. Kobayashi (Journal of Applied Physics, vol. 79, No. 10, p. 7896–7904 (1996)) reported the interface structure between the antiferromagnetic layer and pinned magnetic layer (the film of the Ni—Fe-alloy) when the film of the Ni—Mn alloy is used for the antiferromagnetic layer in.

The report describes "The film grows by keeping a crystal coherency at the NiFe/NiMn interface so that both {111} planes of NiFe and NiMn are parallel to the film surface. Coherent strain at the interface is relaxed by introducing a large number of twins having twining planes parallel to the film surface. However, ordering of the NiMn in the vicinity of the interface is suppressed due to remaining interface strain, making the degree of order high at the site spaced apart from the interface."

The term "coherent" refers to a state where atoms in the antiferromagnetic layer and pinned magnetic layer at the surface exist in 1:1 correspondence with each other and, conversely, the term "incoherent" refers to a state where atoms in the antiferromagnetic layer and pinned magnetic layer at the interface are not located to form respective pairs between the layers.

A heat treatment allows an exchange anisotropic magnetic field to generate at the interface between the NiMn alloy and pinned magnetic field when the antiferromagnetic layer is formed of the NiMn alloy, because the NiFe alloy is transformed from a disordered lattice to an ordered lattice by applying a heat treatment.

While the crystal structure of the NiMn alloy assumes a face centered cubic lattice in which Ni and Mn atoms are distributed at random prior to subjecting to the heat treatment, the crystal structure is transformed from the face centered cubic lattice to the face centered tetragonal lattice after the heat treatment with ordering of the atomic sites (referred to a ordered lattice hereinafter). The ratio (c/a) of the lattice constant a to the lattice constant c of the film of the Ni—Mn alloy when the crystal structure is transformed into a perfectly ordered lattice is 0.942.

Since the lattice constant ratio c/a in the film of the MiMn alloy having a perfectly ordered lattice is relatively close to 1, the lattice strain at the interface generated during the modification from the disordered lattice to the ordered lattice becomes relatively small. Accordingly, the NiMn alloy is transformed from the disordered lattice to the ordered lattice by subjecting the alloy to a heat treatment even if the interface structure between the film of the NiMn alloy and the pinned magnetic layer assumes a coherent state, thereby generating an exchange anisotropic magnetic field.

The lattice strain at the interface is somewhat relaxed by forming twins, as described in the foregoing paper.

As hitherto described, the NiMn alloy has relatively large exchange anisotropic magnetic field as well as a blocking temperature of as high as 300° C., exhibiting superior characteristics to the conventional FeMn alloys. However, the alloy is not sufficient with respect to corrosion resistance as in the FeMn alloys.

Accordingly, X—Mn alloys (X=Pt, Pd, Ir, Rh, Ru and Os) using platinum group elements has been recently noticed for the antiferromagnetic material that is excellent in corrosion resistance along with being able to generate higher exchange anisotropic magnetic field and having a higher blocking temperature.

Using the X—Mn alloy containing platinum group elements as the antiferromagnetic layer makes it possible to improve conventional reproduction output, besides substantially eliminating the drawbacks that the reproduction characteristics are deteriorated by quenching the exchange anisotropic magnetic field due to temperature increase of the element in the magnetic head under operation.

Meanwhile, a heat treatment after deposition is required, as in the case when the NiMn alloy is used for the antiferromagnetic layer, for allowing the exchange anisotropic magnetic field to generate when the X—Mn alloy containing platinum group elements is used for the antiferromagnetic layer.

Although the foregoing paper describes that the interface structure between the NiMn alloy and the pinned magnetic layer (NiFe alloy) remains to be coherent, it was made clear that the exchange anisotropic magnetic field was hardly generated after the heat treatment when the interface structure with the pinned magnetic layer is made to be coherent as in the case of the X—Mn alloy (X is a platinum element).

SUMMARY OF THE INVENTION

The present invention, which is provided to solve the foregoing problems in the prior art, is related to an exchange coupling film that is allowed to generate a large exchange anisotropic magnetic field when an antiferromagnetic material containing elements X (X corresponds to platinum group elements) and Mn is used for the antiferromagnetic layer, and to a megnetoresistive element using this exchange coupling film.

The present invention provides an exchange coupling film in which an antiferromagnetic layer is formed in direct contact with a ferromagnetic layer, an exchange anisotropic magnetic field is generated at the interface between the antiferromagnetic layer and ferromagnetic layer and the magnetization direction of the ferromagnetic layer is fixed along a prescribed direction, wherein the antiferromagnetic layer is formed of an antiferromagnetic material containing at least the element X (wherein X is either one or two or more of the elements Pt, Pd, Ir, Rh, Ru and Os) and Mn, the interface structure between the antiferromagnetic layer and the ferromagnetic layer being non-coherent.

It is preferable that at least a part of the crystal structure of the antiferromagnetic layer after the heat treatment assumes a $L1_0$ type face-centered tetragonal ordered lattice.

It is preferable that crystal orientation of the antiferromagnetic layer is different from the crystal orientation of the ferromagnetic layer at the interface between the antiferromagnetic layer and ferromagnetic layer.

The degree of orientation of the {111} plane of the antiferromagnetic layer is lower than the degree of orientation of the ferromagnetic layer or the plane is non-oriented in contrast to the {111} plane of the ferromagnetic layer being preferentially oriented along the direction parallel to the interface with the antiferromagnetic layer in the present invention.

Otherwise, the degree of orientation of the {111} plane of the ferromagnetic layer is lower than the degree of orientation of the antiferromagnetic layer or the plane is non-oriented in contrast to the {111} plane of the antiferromagnetic layer being preferentially oriented along the direction parallel to the interface with the ferromagnetic layer.

Otherwise, both of the degree of orientation of the {111} plane of the antiferromagnetic layer along the direction parallel to the interface between the antiferromagnetic layer and ferromagnetic layer and the degree of orientation of the {111} plane of the ferromagnetic layer are low or the both planes are non-oriented, the crystal planes except the {111} planes being preferentially oriented along the direction parallel to the interface with different crystal orientations between the antiferromagnetic layer and ferromagnetic layer.

It is preferable in the present invention that the antiferromagnetic layer is formed of a X—Mn alloy and the element X is PT.

It is preferable that the ratio (c/a) of the lattice constant a to the lattice constant c of the antiferromagnetic layer after the heat treatment is within the range of 0.93 to 0.99 when the antiferromagnetic layer is formed of the PtMn alloy.

In the present invention, the antiferromagnetic layer is formed of a X—Mn—X' alloy (wherein X is either one or two or more of the elements of Pt, Pd, Ir, Rh, Ru and Os), the X—Mn—X' being an invasion type solid solution in which the element X' invades into interstices in the space lattice composed of the elements X and Mn, or a substitution type solid solution in which a part of the lattice points of the crystal lattice composed of the element X and Mn is substituted with the element X'. It is especially preferable in the present invention that the element X in the X—Mn—X' alloy to be used for the antiferromagnetic layer is Pt, or the antiferromagnetic layer is formed of a Pt—Mn—X' alloy.

It is preferable in the present invention that the element X' that is used for the antiferromagnetic layer is one or two or more kinds of the elements of Ne, Ar, Kr, Xe, Be, B, C, N, Mg, Al, Si, P, Ti, V, Cr, Fe, Co, Ni, Cu, Zn, Ga, Ge, Zr, Nb, Mo, Ag, Cd, Ir, Sn, Hf, Ta, W, Re, Au, Pb and rare earth elements. It is more preferable that the element X' is one or two or more kinds of the elements of Ne, Ar, Kr and Xe.

It is preferable in the present invention that the composition ratio of the element X' is within the range of 0.2 to 10%, more preferably within the range of 0.5 to 5%, by atomic ratio when the antiferromagnetic layer is formed of a X—Mn—X' alloy.

In addition, it is preferable in the present invention that the composition ratio (X:Mn) between the element X and Mn is within the range of 4:6 to 6:4 when the antiferromagnetic layer is formed of the X—Mn—X' alloy.

The X—Mn—X' alloy to be used for the antiferromagnetic layer is preferably deposited by the sputtering method.

The antiferromagnetic layer is formed of a X—Mn alloy (wherein X is either one or two or more of the elements of Pt, Pd, Ir, Rh, Ru and Os), and it is preferable that the antiferromagnetic layer is formed on the ferromagnetic layer with the composition ratio of X in the X—Mn alloy of within the range of 47 to 57% by atomic ratio.

The antiferromagnetic layer is formed of the X—Mn—X' alloy (wherein X is either one or two or more of the elements of Pt, Pd, Ir, Rh, Ru and Os and X' is one or two or more kinds of the elements of Ne, Ar, Kr, Xe, Be, B, C, N, Mg, Al, Si, P, Ti, V, Cr, Fe, Co, Ni, Cu, Zn, Ga, Ge, Zr, Nb, Mo, Ag, Cd, Ir, Sn, Hf, Ta, W, Re, Au, Pb and rare earth elements)

in the present invention, wherein the antiferromagnetic layer is formed over the ferromagnetic layer and it is preferable that the composition ratio of X+X' in the X—Mn—X' alloy is within the range of 47 to 57% by atomic ratio.

It is more preferable in the present invention that the composition ratio of X in the X—Mn alloy or the composition ratio of X+X' in the X—Mn—X' alloy is within the range of 50 to 56% by atomic ratio in the present invention.

It is preferable in the present invention that the antiferromagnetic layer is formed of the X—Mn alloy (wherein X is either one or two or more of the elements of Pt, Pd, Ir, Rh, Ru and Os), the antiferromagnetic layer being formed under the ferromagnetic layer with the preferable composition ratio of X in the X—Mn alloy of within the range of 44 to 57% by atomic ratio.

It is preferable in the present invention that the antiferromagnetic layer is formed of the X—Mn—X' alloy (wherein X is either one or two or more of the elements of Pt, Pd, Ir, Rh, Ru and Os and X' is one or two or more kinds of the elements of Ne, Ar, Kr, Xe, Be, B, C, N, Mg, Al, Si, P, Ti, V, Cr, Fe, Co, Ni, Cu, Zn, Ga, Ge, Zr, Nb, Mo, Ag, Cd, Ir, Sn, Hf, Ta, W, Re, Au, Pb and rare earth elements), the antiferromagnetic layer being formed under the ferromagnetic layer and the composition ratio of X+X' in the X—Mn—X' alloy being within the range of 44 to 57% by atomic ratio.

It is preferable in the present invention that the composition ratio of X in the X—Mn alloy or the composition ratio of X+X' in the X—Mn—X' alloy is within the range of 46 to 55% by atomic ratio.

The exchange coupling film produced by the method as described above can be used for a variety of magnetoresistive element.

Firstly, the single spin-valve type thin film element according to the present invention has an antiferromagnetic layer, a pinned magnetic layer formed in direct contact with this antiferromagnetic layer in which the magnetization direction is fixed by an exchange anisotropic magnetic field with the antiferromagnetic layer, a free magnetic layer formed over or under the pinned magnetic layer via a non-magnetic conductive layer, a bias layer for aligning the magnetization direction of the free magnetic layer along the direction to cross with the magnetization direction of the pinned magnetic layer and a conductive layer for imparting a sensing current to the pinned magnetic layer and non-magnetic conductive layer, wherein the antiferromagnetic layer and pinned magnetic layer formed in direct contact with this antiferromagnetic layer are formed of the exchange coupling film described above.

In the present invention, the antiferromagnetic layer is formed on the top or bottom sides of the free magnetic layer of the single spin-valve type thin film element with a space apart by a track width Tw, and the antiferromagnetic layer and free magnetic layer may be formed of the exchange coupling film as described previously.

Secondly, the dual spin-valve type thin film element according to the present invention has non-magnetic conductive layers formed on the top and bottom faces of the free magnetic layer, pinned magnetic layers being situated on the top face of one of the non-magnetic conductive layer and under the bottom face of the other non-magnetic conductive layer, antiferromagnetic layers being situated on the top face of one of the pinned magnetic layer and on the bottom face of the other pinned magnetic layer to fix magnetization directions of respective pinned magnetic layers along a prescribed direction by an exchange anisotropic magnetic field, and a bias layer for aligning the magnetization direction of the free magnetic layer along the direction to cross with the magnetization direction of the pinned magnetic layer, the antiferromagnetic layer and the pinned magnetic layer formed in direct contact with this antiferromagnetic layer being formed of the exchange coupling film described above.

The AMR element according to the present invention has a magnetoresistive layer and a soft magnetic layer laminated via a non-magnetic layer, wherein an antiferromagnetic layer is formed on the top or bottom side of the magnetoresistive layer with a space apart by a tack width Tw, the antiferromagnetic layer and magnetoresistive layer being formed of the exchange coupling film described above.

Shield layers are formed on the top and bottom faces of the foregoing magnetoresistive element via gap layers in the magnetic head according to the present invention.

The interface structure between the antiferromagnetic layer and ferromagnetic layer is made to be non-coherent in the present invention to obtain a proper exchange anisotropic magnetic field when an antiferromagnetic material containing at least the element X (wherein X is either one or two or more kinds of the elements of Pt, Pd, Ir, Rh, Ru and Os) and Mn is used for the antiferromagnetic layer.

The interface structure between the antiferromagnetic layer and the ferromagnetic layer is made non-coherent in order to transform the crystal structure of the antiferromagnetic layer from the disordered lattice to the ordered lattice after subjecting the layers to a heat treatment, thereby allowing a larger exchange anisotropic magnetic field to generate. The relation between the non-coherency and exchange anisotropic magnetic field will be discussed in detail hereinafter.

While the non-coherency means that atoms at the antiferromagnetic layer side and at the ferromagnetic layer side do not show 1 to 1 correspondence at the interface between the antiferromagnetic layer and ferromagnetic layer with different positional relations of respective atoms, it is necessary to properly control the lattice constant before the heat treatment for making the interface structure non-coherent.

The antiferromagnetic layer is formed, for example, of the X—Mn alloy (wherein X is either one or two or more of the elements of Pt, Pd, Ir, Rh, Ru and Os).

The difference between the lattice constant of the X—Mn alloy and the lattice constant of the ferromagnetic layer (for example the NiFe alloy) before the heat treatment is adjusted to be large in the present invention by properly selecting the composition ratio of X in the X—Mn alloy.

Although both of the crystal structure of the X—Mn alloy in the deposition step (before the heat treatment) and the crystal structure of the ferromagnetic layer assumes a face-centered tetragonal lattice (referred to a disordered lattice hereinafter) in which X and Mn atoms are distributed at random, the interface structure between the X—Mn alloy in the deposition step (before the heat treatment) and ferromagnetic layer are liable to be non-coherent since the difference between the lattice constant of the X—Mn alloy and the lattice constant of the ferromagnetic layer are adjusted to be large in the present invention as described previously.

As hitherto described, the interface between the antiferromagnetic layer and ferromagnetic layer is made to be non-coherent by virtue of a proper selection of the composition ratio of the element X in using the X—Mn alloy (X is, for example, Pt or Pd) as an antiferromagnetic layer. However, the lattice constant of the antiferromagnetic layer can be enlarged by allowing an element X' such as a rare gas element (for example Ne or Ar) to contain in the X—Mn alloy in the present invention, making it possible to set the interface structure between the antiferromagnetic layer and ferromagnetic layer to be non-coherent.

It is preferable in the present invention that the crystal orientation of the X—Mn alloy or X—Mn—X' alloy is different from that of the ferromagnetic layer. The degree of the crystal orientation may be possibly changed depending on the presence of underlayers, composition ratio, conditions such as electric voltage and gas pressure during sputtering deposition, or the lamination order of the films.

The crystal orientation of the X—Mn alloy or X—Mn—X' alloy is made to be different from the crystal orientation of the ferromagnetic layer because, for example, when the {111} plane of the ferromagnetic layer is preferentially oriented along the direction parallel to the film surface and the {111} plane of the X—Mn alloy or X—Mn—X' alloy is also preferentially oriented along the direction parallel to the film surface, non-coherence of the crystal structure can not be valid.

Accordingly, the degree of orientation of the {111} plane of the X—Mn alloy or X—Mn—X' alloy is properly controlled to be smaller than the degree of orientation of the ferromagnetic layer or to be non-oriented when, for example, the {111} plane of the ferromagnetic layer is preferentially oriented along the direction parallel to the interface between the antiferromagnetic layer and the X—Mn alloy or X—Mn—X' alloy, thereby making it possible to keep the non-coherency of the interface structure.

As hitherto described, the exchange anisotropic magnetic field is generated at the interface between the X—Mn alloy or X—Mn—X' alloy and the ferromagnetic layer by applying a heat treatment after laminating the X—Mn alloy or X—Mn—X' alloy with the ferromagnetic layer so that the interface structure assumes a non-coherent state. Generation of this exchange anisotropic magnetic field is ascribed to transformation of the crystal structure of the X—Mn alloy or X—Mn—X' alloy from the disordered phase to the face-centered tetragonal lattice in which X and Mn atoms are aligned with an order.

The face-centered tetragonal lattice defined in the present invention refers to so called $L1_0$ type face-centered tetragonal lattice (referred to the ordered lattice hereinafter) in which the centers of the four planes among the six planes of the unit lattice are occupied by the X atoms while the corners of the unit lattice and the centers of the top and bottom planes are occupied by the Mn atoms. It is required that at least a part of the crystal structure of the X—Mn alloy or X—Mn—X' alloy after the heat treatment assumes the ordered lattice described above.

While the exchange anisotropic magnetic field is generated as a result of modification of the crystal structure of the X—Mn alloy or X—Mn—X' alloy from the disordered lattice to the ordered lattice by applying the heat treatment as hitherto described, the lattice distortion accompanied by this modification becomes larger in the X—Mn alloy or X—Mn—X' alloy than in the NiMn alloy.

The interface structure between the X—Mn alloy or X—Mn—X' alloy and the ferromagnetic alloy before the heat treatment can be made to be non-coherent in the present invention by optimizing the composition ratio in the X—Mn alloy or by adding an element X' as a third element to the X—Mn alloy.

When the interface structure between the antiferromagnetic layer and ferromagnetic layer is non-coherent, the crystal structure of the X—Mn alloy or X—Mn—X' alloy is liable to be transformed by applying a heat treatment from the disordered lattice to the ordered lattice, thereby generating a large exchange anisotropic magnetic field at the interface.

The X—Mn alloy (X=Pt, Pd and the like) or X—Mn—X' alloy (X=Ne, Ar and the like) has excellent characteristics as an antiferromagnetic material with respect to superior corrosion resistance to the FeMn alloy or NiMn alloy as well as higher blocking temperature and larger exchange anisotropic magnetic field (Hex) than the FeMn alloy.

It is preferable in the present invention to select Pt for the element X constituting the X—Mn alloy or X—Mn—X' alloy.

As hitherto described in detail, the exchange coupling film composed of an antiferromagnetic layer formed of the X—Mn alloy or X—Mn—X' alloy and a ferromagnetic layer can be applied for the magnetoresistive element.

The antiferromagnetic layer and pinned magnetic layer made of a single spin-valve type thin film element and dual spin-valve type thin film element are formed of the exchange coupling film as, for example, the magnetoresistive element in the present invention.

The construction described above enables to tightly fix magnetization of the pinned magnetic layer along the prescribed direction, making it possible to obtain good reproduction characteristics as compared with the conventional elements.

In aligning the magnetization direction in the free magnetic layer of the single spin-valve type thin film element or the magnetoresistive element layer of the AMR element, for example, the exchange bias layer and free magnetic layer, or the exchange bias layer and the magnetoresistive layer may be formed of the exchange coupling film described above.

The construction above makes it possible to properly aligned the magnetization of the free magnetic layer and magnetoresistive layer, thus making it possible to realize good reproduction characteristics.

DESCRIPTION OF THE PREFERRED EMBODIMENT

Figure 1:
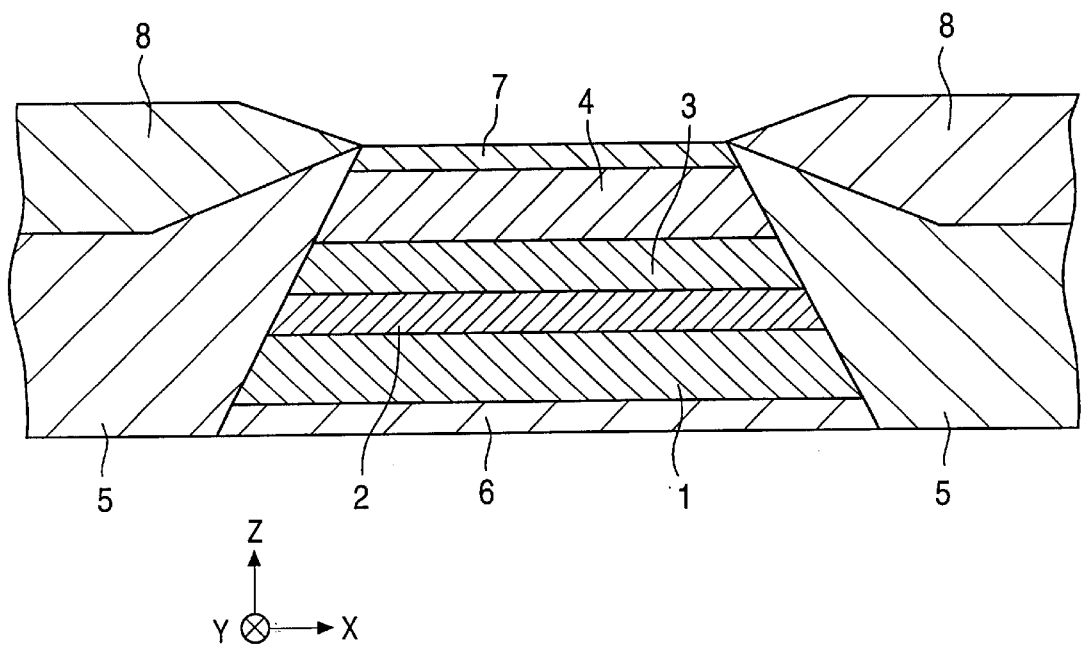
FIG. 1 is a cross section of the structure of the single spin-valve type thin film element according to the first embodiment of the present invention viewed from the ABS face side.

FIG. 1 is across section of the structure of the single spin-valve type thin film element according to the first embodiment of the present invention viewed from the ABS face side. Only the central portion of the element elongating along the X-direction is indicated in FIG. 1 by a broken line.

This single spin-valve type thin film element is mounted at the trailing side end portion of a floating type slider provided in a hard disk device to sense recording magnetic field from the hard disk unit. The travelling direction of the hard disk device is along the Z-direction while the direction of leakage magnetic field from the recording medium such as the hard disk device is along the Z-direction.

An underlayer 6 formed of a non-magnetic material such as Ta (tantalum) is formed at the lowest bottom in FIG. 1. A free magnetic layer 1, a non-magnetic conductive layer 2, a pinned magnetic layer 3 and an antiferromagnetic layer 4 are laminated from the bottom to the top on this underlayer 6. A protective layer 7 made of tantalum (Ta) is formed on the antiferromagnetic layer 4.

Hard bias layers 5, 5 are laminated on both sides of six layers from the underlayer 6 to the protective layer 7, conductive layers 8, 8 being laminated on the hard bias layers 5, 5.

The free magnetic layer 1 and pinned magnetic layer 3 are formed of a NiFe alloy, CoFe alloy, Co alloy, Co or CoNiFe alloy in the present invention.

While the free magnetic layer 1 is a monolayer as shown in FIG. 1, this layer may be a multi-layer. This means that the free magnetic layer 1 may have a laminated structure of the NiFe alloy and CoFe alloy or a laminated structure of the NiFe alloy and Co.

The non-magnetic conductive layer 2 laying between the free magnetic layer 1 and pinned magnetic layer 3 is formed of Cu. The hard bias layers 5, 5 are formed of, for example, a Co—Pt (cobalt-platinum) alloy or Co—Cr—Pt (cobalt-chromium-platinum) alloy while the conductive layers 8, 8 are formed of Cu (copper), W (tungsten) or Cr (chromium).

The antiferromagnetic layer 4 formed on the pinned magnetic layer 3 is formed of an antiferromagnetic material containing at least an element X (wherein X is either one or two or more of the elements of Pt, Pd, Ir, Rh, Ru and Os) and Mn in the present invention.

The interface structure between the pinned magnetic layer 3 and antiferromagnetic layer 4 shown in FIG. 1 assumes a non-coherent state in the present invention while at least a part of the crystal structure of the antiferromagnetic layer 4 at the interface assumes a L1$_0$ type face-centered tetragonal lattice (referred to a ordered lattice hereinafter).

In the L1$_0$ type face-centered tetragonal lattice as used herein, the centers of the four side faces among the six side faces of a unit lattice are occupied by the X-atoms (X=Pt, Pd, Ir, Rh, Ru or Os) and the corners of the unit lattice and the centers of the top and bottom faces are occupied by the Mn atoms.

It is preferable for the pinned magnetic layer 3 and antiferromagnetic layer 4 to readily assume a non-coherent state in the present invention that the crystal orientation of the pinned magnetic layer 3 is different from the crystal orientation of the antiferromagnetic layer 4.

The {111} planes of the free magnetic layer 1, non-magnetic conductive layer 2 and pinned magnetic layer 3 formed on the underlayer 6 are preferentially oriented along the direction parallel to the film surface, because the underlayer 6 is provided in the single spin-valve type thin film element shown in FIG. 1.

On the contrary, the {111} plane of the antiferromagnetic layer 4 formed on the pinned magnetic layer 3 has smaller degree of orientation than that of the {111} plane of the pinned magnetic layer 3, or the former plane is not oriented at all. In other words, the crystal orientations in the vicinity of the interfaces between the pinned magnetic layer 3 and antiferromagnetic layer 4 are different with each other, allowing the structure at the interface liable to be non-coherent.

The interface structure between the pinned magnetic layer 3 and antiferromagnetic layer 4 is adjusted to be non-coherent in the step prior to the heat treatment in the present invention in order to gain a proper exchange anisotropic magnetic field by transforming the crystal structure of the antiferromagnetic layer 4 from the disordered lattice (face-centered tetragonal lattice) to the ordered lattice as described previously.

In other words, the crystal structure of the antiferromagnetic layer 4 could be hardly transformed from the disordered lattice to the ordered lattice as a result of applying a heat treatment when the interface structure is coherent, causing a problem that exchange anisotropic magnetic field can not be obtained.

The antiferromagnetic layer 4 is formed of a X—Mn alloy (wherein X is either one or two or more of the elements of Pt, Pd, Ir, Rh, Ru and Os) in the present invention. It is especially preferable in the present invention that the antiferromagnetic layer 4 is formed of a PtMn alloy.

The X—Mn alloy, especially the PtMn alloy, has excellent characteristics as an antiferromagnetic material with respect to superior corrosion resistance to the FeMn alloy or NiMn alloy that has been conventionally used for the antiferromagnetic layer as well as higher blocking temperature and larger exchange anisotropic magnetic field (Hex).

It is preferable in the present invention that the ratio (c/a) between the lattice constants a and c of the antiferromagnetic layer 4 after applying a heat treatment, or when at least a part of the crystal structure assumes an ordered lattice, is within the range of 0.93 to 0.99 when the antiferromagnetic layer 4 is formed of the PtMn alloy.

Almost all the crystal structure of the antiferromagnetic layer 4 assumes an ordered lattice when the ratio (c/a) between the lattice constants a and c is 0.93 or less. Such conditions are not preferable since adhesive property between the pinned magnetic layer 3 and antiferromagnetic layer 4 is deteriorated, causing peeling of the film.

It is not preferable that the ratio (c/a) between the lattice constants a and c is 0.93 or more because almost all the crystal structure of the antiferromagnetic layer 4 assumes a disordered lattice resulting in small exchange anisotropic magnetic field generated at the interface between the antiferromagnetic layer 4 and pinned magnetic layer 3.

Meanwhile, the composition ratio of the X—Mn alloy is determined to the values to be described hereinafter in the present invention in order to allow the interface structure between the pinned magnetic layer 3 and antiferromagnetic layer 4 to be non-coherent prior to subjecting to a heat treatment when the antiferromagnetic layer 4 is formed of the X—Mn alloy (wherein X is either one or two or more of the elements of Pt, Pd, Ir, Rh, Ru and Os).

It is preferable that the composition ratio of the element X in the X—Mn alloy is within the range of 47 to 57% by atomic ratio when the antiferromagnetic layer 4 is formed of the X—Mn alloy (wherein X is either one or two or more of the elements of Pt, Pd, Ir, Rh, Ru and Os) along with forming the antiferromagnetic layer 4 on the pinned magnetic layer 3. It is more preferable that the composition ratio of the element X in the X—Mn alloy is within the range of 50 to 56% by atomic ratio.

When the antiferromagnetic layer 4 is formed with a composition ratio within the range as described above, the difference between the lattice constant of the antiferromagnetic layer 4 before the heat treatment, or when the crystal structure assumes a disordered lattice, and the lattice constant of the pinned magnetic layer 3 can be enlarged, thereby making it possible to maintain non-coherency of the interface structure between the pinned magnetic layer 3 and antiferromagnetic layer 4 before subjecting to a heat treatment.

Applying a heat treatment under the conditions as described above allows the exchange anisotropic magnetic field to be generated owing to changes in the crystal structure of the antiferromagnetic layer 4. When the composition ratio of the element X in the X—Mn alloy is within the range of 47 to 57% by atomic ratio as described above, it is possible to obtain an exchange anisotropic magnetic field of 400 Oe (Oersted) or more. When the composition ratio of the element X in the X—Mn alloy is within the range of 50 to 56% by atomic ratio, an exchange anisotropic magnetic field of 600 Oe or more can be obtained.

As hitherto described, it is possible for the interface structure between the antiferromagnetic layer 4 and pinned magnetic layer 3 before the heat treatment to maintain non-coherency by adjusting the composition ratio of the element X within the range described above when the X—Mn alloy is used for the antiferromagnetic layer 4.

The lattice constant of the antiferromagnetic layer 4 can be increased in the present invention by adding an element X' as a third element in the X—Mn alloy, also enabling to keep non-coherency of the interface structure between the antiferromagnetic layer 4 and pinned magnetic layer 3.

The X—Mn—X' alloy in which the element X' is added in the X—Mn alloy is an invasion type solid solution in which the element X' invades into interstices of the space lattice composed of the element X and Mn, or a substitution type solid solution in which a part of the lattice points of the crystal lattice composed of the element X and Mn is substituted with the element X'. The solid solution as used herein refers to a solid in which respective components are uniformly distributed in a wide range. It is preferable in the present invention that the element X is Pt.

The X—Mn—X' alloy is deposited by the sputtering method in the present invention. The X—Mn—X' alloy is deposited under a non-equilibrium condition and the element X' in the film invades into the interstices of the space lattice composed of the element X and Mn or a part of the lattice points of the crystal lattice composed of the element X and Mn is substituted with the element X' in the deposited X—Mn—X' alloy. The lattice is expanded by allowing the element X' to form an invasion type or substitution type solid solution in the X—Mn alloy lattice, thereby making the lattice constant of the antiferromagnetic layer 4 larger than the lattice constant of the layer in which the element X' is not added.

While various elements can be used for the element X' in the present invention, use of highly reactive halogens and O (oxygen) are not preferable since these elements selectively react with Mn hindering the crystal structure of the face-centered orthogonal crystal system from being maintained. Examples of the element X' in the present invention include one or two or more of the element of Ne, Ar, Kr, Xe, Be, B, C, N, Mg, Al, Si, P, Ti, V, Cr, Fe, Co, Ni, Cu, Zn, Ga, Ge, Zr, Nb, Mo, Ag, Cd, Ir, Sn, Hf, Ta, W, Re, Au, Pb and rare earth elements (Sc, Y and lanthanide elements (La, Ce, Pr, Nd, Pm, Sm, Eu, Gd, Tb, Dy, Ho, Er, Tm, Yb and Lu)).

The lattice constant of the antiferromagnetic layer 4 can be increased by sputtering by using any of the various elements X'. However, the features as an antiferromagnetic material is diminished when the composition ratio of the element X' is too large in using the element X' that forms a substitution type solid solution, reducing the exchange coupling magnetic field generated at the interface with the pinned magnetic layer 3.

It is especially preferable in the present invention to use rare gas elements (Ne, Ar, Kr and Xe) of the inert gas as the element X' that forms an invasion type solid solution. Since these rare gas elements are chemically inert, they do not largely affect the antiferromagnetic characteristics even when the rare gas elements are contained in the film. Moreover, Ar is a gas that has bee n conventionally used for introducing into the sputtering apparatus, meaning that Ar can easily invade into the film merely by properly adjusting the gas pressure or the energy of the sputtering particles.

While it is difficult to make a large amount of the element X' to be contained in the film when rare gas elements are used for the element X', it has been experimentally confirmed that a small amount of the invaded rare gas element allows the exchange coupling magnetic field generated by the heat treatment to be largely increased.

The composition ratio of the element X' is prescribed in the present invention in the preferable range of 0.2 to 10% by atomic ratio, or in the more preferable range of 0.5 to 5% by atomic ratio. It is preferable that the composition ratio X:Mn between the elements X and Mn is within the range of 4:6 to 6:4. When the composition ratio of the element X' and the composition ratio X:Mn between the elements X and Mn are adjusted within the ranges as described above, the lattice constant of the antiferromagnetic layer 4 in deposition (before heat treatment) can be enlarged along with making the exchange coupling magnetic field generated at the interface between the antiferromagnetic layer 4 and pinned magnetic layer 3 larger by applying a heat treatment than the magnetic field in the layer not containing the element X'.

It is preferable in the present invention that the composition ratio of X+X' in the X—Mn—X' alloy is in the range of 47 to 57% by atomic ratio, more preferably within the range of 50 to 56% by atomic ratio, when the antiferromagnetic layer 4 composed of the X—Mn—X' alloy (wherein X is either one or two or more of the elements of Pt, Pd, Ir, Rh, Ru and Os and X' is one or two or more of the elements of Ne, Ar, Kr, Xe, Be, B, C, N, Mg, Al, Si, P, Ti, V, Cr, Fe, Co, Ni, Cu, Zn, Ga, Ge, Zr, Nb, Mo, Ag, Cd, Ir, Sn, Hf, Ta, W, Re, Au, Pb and rare earth elements) is formed on the pinned magnetic layer 3 as shown in FIG. 1.

Magnetization of the pinned magnetic layer is fixed along the Y-direction shown in FIG. 1 forming a single magnetic domain due to exchange coupling magnetic field generated at the interface between the antiferromagnetic layer 4 and pinned magnetic layer 3 as a result of heat treatment. The element X' may sometimes escape from the film during heat treatment when the element X' in the X—Mn—X' alloy to be used for the antiferromagnetic layer 4 is a gas element, making the composition ratio of the element X' smaller than the composition ratio of X' immediately after deposition. It may sometime happen that the element X' completely escape out of the film to remain the film composition to be X—Mn. However, the heat treatment allows the crystal structure of the antiferromagnetic layer 4 to properly transform from the disordered lattice (face-centered orthogonal lattice) to the ordered lattice when the interface structure between the pinned magnetic layer 3 and ferromagnetic layer 4 is made to be non-coherent, making it possible to obtain a large exchange anisotropic magnetic field.

The free magnetic layer 1 is aligned along the X-direction shown in the drawing by virtue of the hard bias layers 5, 5 formed on both sides of the hard bias layers.

A static current (a sensing current) is imparted from the conductive layer 8 to the free magnetic layer 1, non-magnetic conductive layer 2 and pinned magnetic layer 3 in the single spin-valve type thin film element shown in FIG. 1. In addition, when a magnetic field is applied along the Y-direction from the recording medium, the magnetization direction of the is turned from the X-direction to the Y-direction. Conduction electrons are scattered at the interface between the non-magnetic conductive layer 2 and pinned magnetic layer 3 or at the interface between the non-magnetic conductive layer 2 and free magnetic layer 1 causing a change in electric resistance, thereby enabling to obtain a sensing output.

Figure 2:
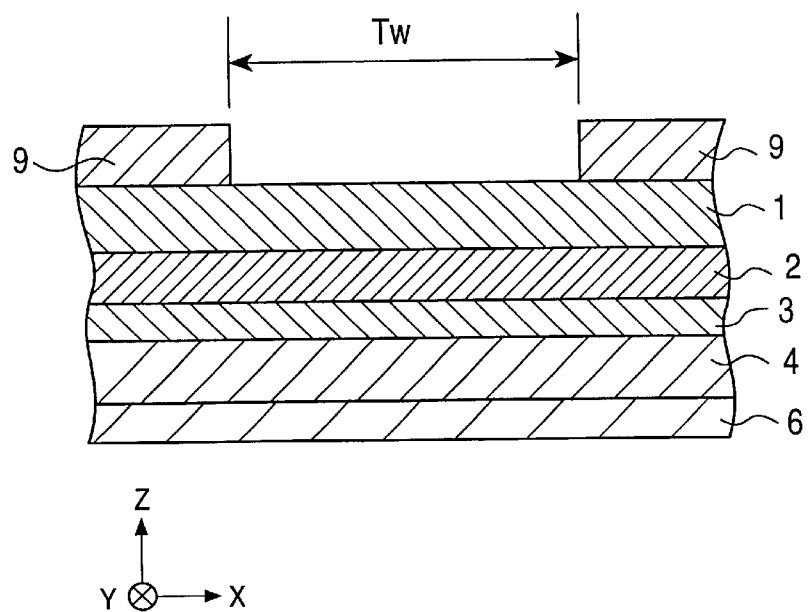
FIG. 2 is a cross section of the structure of the single spin-valve type thin film element according to the second embodiment of the present invention viewed from the ABS face side.

FIG. 2 is a cross section showing the structure of the single spin-valve type thin film element according to the second embodiment of the present invention.

As shown in FIG. 2, an underlayer 6, an antiferromagnetic layer 4, a pinned magnetic layer 3, a non-magnetic conductive layer 2 and a free magnetic layer 1 are continuously laminated from the bottom to the top.

The antiferromagnetic layer 4 is, like the antiferromagnetic layer 4 shown in FIG. 1, is formed of a X—Mn alloy (wherein X is either one or two or more of the elements of Pt, Pd, Ir, Rh, Ru and Os) or, preferably, of a Pt—Mn alloy or a X—Mn—X' alloy (wherein X' is one or two or more kinds of the elements of Ne, Ar, Kr, Xe, Be, B, C, N, Mg, Al, Si, P, Ti, V, Cr, Fe, Co, Ni, Cu, Zn, Ga, Ge, Zr, Nb, Mo, Ag, Cd, Ir, Sn, Hf, Ta, W, Re, Au, Pb and rare earth elements).

The pinned magnetic layer 3, non-magnetic conductive layer 2 and free magnetic layer 1 are formed of the material described in FIG. 1.

The interface between the pinned magnetic layer 3 and antiferromagnetic layer 4 is also made to be non-coherent in this embodiment and at least a part of the crystal structure at the interface with the antiferromagnetic layer 4 is a $L1_0$ type face-centered orthogonal lattice (referred to an ordered lattice hereinafter).

While the {111} plane of the antiferromagnetic layer 4 formed on the Ta underlayer 6 is preferentially oriented along the direction parallel to the interface, the degree of orientation of the {111} plane of the pinned magnetic layer 3 along the interface direction becomes lower than the degree of orientation of the antiferromagnetic layer 4 or the former plane tends to be non-oriented when the pinned magnetic layer 3 is formed on the antiferromagnetic layer 4. Since the degree of crystal orientation of the antiferromagnetic layer 4 is different from that of the pinned magnetic layer 3 in FIG. 2, it is made possible to allow the interface structure to be more non-coherent.

When the antiferromagnetic layer 4 is formed of the X—Mn alloy (wherein X is either one or two or more of the elements of Pt, Pd, Ir, Rh, Ru and Os) and the antiferromagnetic layer 4 is formed under the pinned magnetic layer 3, it is preferable that the composition ratio of the element X in the X—Mn alloy constituting the antiferromagnetic layer 4 is 44 to 57% by atomic ratio. The range described above makes it possible to obtain an exchange anisotropic magnetic field of 400 Oe or more. The more preferable range of the composition ratio of the X—Mn alloy is 46 to 55% by atomic ratio, which enables to obtain an exchange anisotropic magnetic field of 600 Oe or more.

The composition within the range described above allows the exchange anisotropic magnetic field to be large because the difference between the lattice constant of the antiferromagnetic layer 4 (disordered lattice) and the lattice constant of the pinned magnetic layer 3 before the heat treatment can be made large, allowing the interface structure before the heat treatment to be non-coherent.

Accordingly, applying a heat treatment enables at least a part of the crystal structure of the antiferromagnetic layer 4 at the interface to be transferred into an ordered lattice that is required for allowing the exchange anisotropic magnetic field to be generated from the disordered lattice.

The X—Mn—X' alloy is deposited by the sputtering method when the antiferromagnetic layer 4 is formed of the X—Mn—X' alloy (wherein X' is one or two or more kinds of the elements of Ne, Ar, Kr, Xe, Be, B, C, N, Mg, Al, Si, P, Ti, V, Cr, Fe, Co, Ni, Cu, Zn, Ga, Ge, Zr, Nb, Mo, Ag, Cd, Ir, Sn, Hf, Ta, W, Re, Au, Pb and rare earth elements), forming an invasion type solid solution in which the element X' invades into interstices of the space lattice composed of the element X and Mn, or a substitution type solid solution in which a part of the lattice points of the crystal lattice composed of the element X and Mn is substituted with the element X'.

The lattice constant of the antiferromagnetic layer 4 containing the element X' in the film becomes larger than the lattice constant of the antiferromagnetic layer 4 not containing the element X', allowing the interface structure between the antiferromagnetic layer 4 and pinned magnetic layer 3 in deposition (before the heat treatment) to be kept non-coherent.

The composition ratio of the element X' occupied in the film is prescribed to be 0.2 to 10% by atomic ratio, more preferably to be 0.5 to 5% by atomic ratio, in the present invention. A more larger exchange coupling magnetic field can be obtained when the composition of the element X' is prescribed in the forgoing range along with determining the composition ratio X:Mn of the element x and Mn to be in within the range of 4:6 to 6:4.

It is preferable in the present invention that the composition ratio of X+X' in the X—Mn—X' alloy is within the range of 44 to 47% by atomic ratio when the antiferromagnetic layer 4 is formed under the pinned magnetic layer 3 as shown in FIG. 2. The more preferable range of X+X' in the X—Mn—X' alloy is from 46 to 55% by atomic ratio.

Magnetization of the pinned magnetic layer 3 shown in FIG. 2 is fixed forming a single magnetic domain along the Y-direction by the exchange anisotropic magnetic field generated at the interface with the antiferromagnetic layer 4.

An exchange bias layer 9 (an antiferromagnetic layer) is formed on the free magnetic layer 1 with a space apart by a track width Tw.

The exchange bias layer 9 is formed of the X—Mn alloy (wherein X is either one or two or more of the elements of Pt, Pd, Ir, Rh, Ru and Os), preferably of the PtMn alloy or X—Mn—X' alloy (wherein X' is one or two or more kinds of the elements of Ne, Ar, Kr, Xe, Be, B, C, N, Mg, Al, Si, P, Ti, V, Cr, Fe, Co, Ni, Cu, Zn, Ga, Ge, Zr, Nb, Mo, Ag, Cd, Ir, Sn, Hf, Ta, W, Re, Au, Pb and rare earth elements).

The composition ratio of the element X in the X—Mn alloy is adjusted within the range of 47 to 57% by atomic ratio. More preferable range of the composition ratio of the element X in the X—Mn alloy is 50 to 56% by atomic ratio. This composition range is the same as the composition range of the antiferromagnetic layer 4 described in FIG. 1. In the case of the X—Mn—X' alloy, the composition range of the element X' is 0.2 to 10% by atomic ratio, more preferable composition range being 0.5 to 5% by atomic ratio. The composition ratio X:Mn between the element X and Mn is 4:6 to 6:4. It is preferable that the composition ratio of X+X' in the X—Mn—X' alloy is within the range of 47 to 57 by atomic ratio, more preferable range of the composition ratio of X+X' in the X—Mn—X' alloy being from 50 to 56% by atomic ratio.

The composition range described above allows the interface structure between the free magnetic layer 1 and exchange bias layer 9 to be non-coherent, making it possible to obtain an exchange anisotropic magnetic field of 400 Oe or more at least at the interface. However, since the exchange bias layers 9, 9 are not formed on the track width Tw portion as shown in FIG. 2, both ends of the free magnetic layer 1 are set forming a single magnetic domain along the X-direction by being strongly affected by the exchange anisotropic magnetic field to properly align magnetization in the track width Tw region of the free magnetic layer 1 in an extent so as to allow the magnetization to respond to the external magnetic field.

Magnetization in the track width Tw region of the free magnetic layer 1 is turned from the X-direction to the Y-direction due to the external magnetic field along the Y-direction in the single spin-valve type thin film element formed as described above. Electric resistance is varied depending on the relation between the change of the magnetization direction in the free magnetic layer 1 and the pinned magnetization direction (the Y-direction) of the pinned magnetic layer 3. The leakage magnetic field from the recording medium is sensed by the voltage change based on the electric resistance change as described above.

Figure 3:
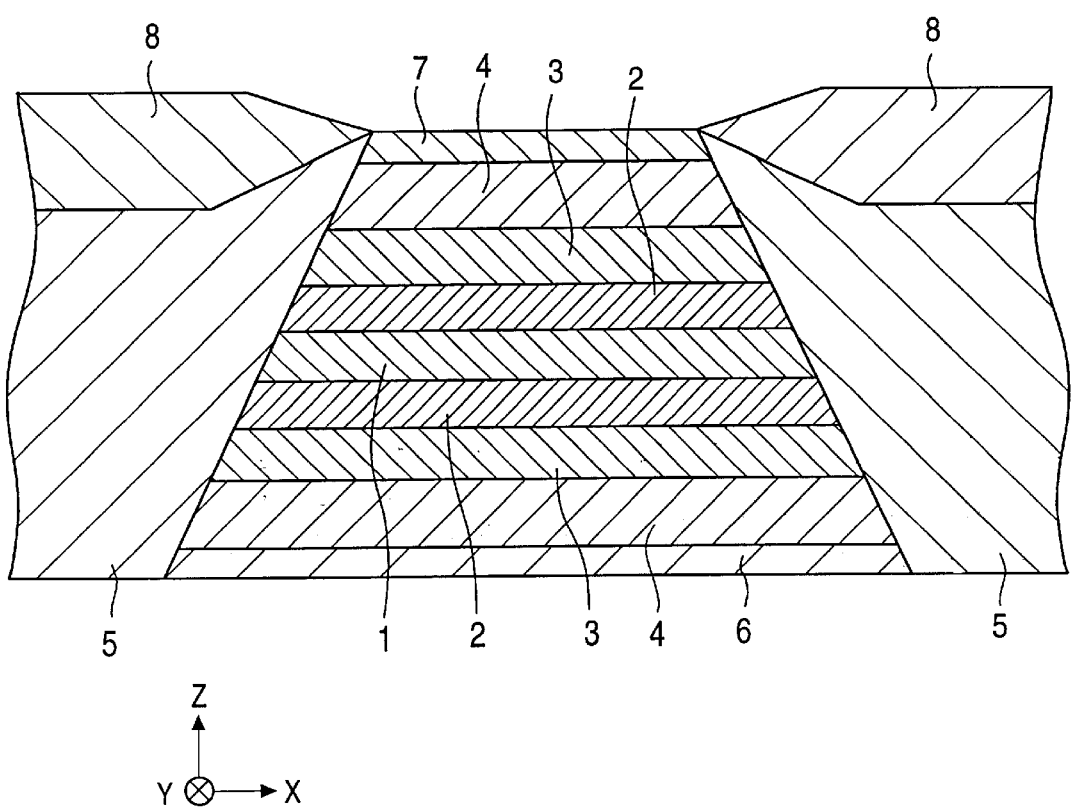
FIG. 3 is a cross section of the structure of the dual spin-valve type thin film element according to the third embodiment of the present invention viewed from the ABS face side.

FIG. 3 is a cross section showing the structure of the dual spin-valve type thin film element according to the third embodiment of the present invention.

As shown in the drawing, an underlayer 6, an antiferromagnetic layer 4, a pinned magnetic layer 3, a non-magnetic conductive layer 2 and a free magnetic layer 1 are continuously laminated from the bottom to the top. In addition, a non-magnetic conductive layer 2, a pinned magnetic layer 3, an antiferromagnetic layer 4 and a protective layer 7 are continuously laminated on the free magnetic layer 1.

Hard bias layers 5, 5 and conductive layers 8, 8 are laminated on both sides of the multilayer film from the underlayer 6 to the protective layer 7.

Each layer is formed of the same material as described in FIG. 1 and FIG. 2.

It is preferable that the composition ratio of the element X in the X—Mn alloy constituting the antiferromagnetic layer 4 is within the range of 44 to 57% by atomic ratio, more preferably within the range of 46 to 55% by atomic ratio, as in the antiferromagnetic layer 4 shown in FIG. 2, since the antiferromagnetic layer 4 formed below the free magnetic layer 1 is formed under the pinned magnetic layer 3 as shown in FIG. 3.

It is also preferable that the composition ratio of the element X in the X—Mn alloy constituting the antiferromagnetic layer 4 is within the range of 44 to 57% by atomic ratio, more preferably within the range of 50 to 56% by atomic ratio, as in the antiferromagnetic layer 4 shown in FIG. 1, since the antiferromagnetic layer 4 formed above the free magnetic layer 1 is formed on the pinned magnetic layer 3.

The composition range as described above allows the difference between the lattice constant of the pinned magnetic layer 3 and the lattice constant of the antiferromagnetic layer 4 before the heat treatment to be large, allowing the interface structure before the heat treatment to be non-coherent. Accordingly, applying a heat treatment makes it possible to transform a part of the crystal structure at the interface from the disordered structure to the ordered structure that is required for generating an exchange anisotropic magnetic field. It is preferable that the ratio (c/a) between the lattice constants a and c in the antiferromagnetic layer 4 after the heat treatment is within the range of 0.93 to 0.99.

The interface structure is enabled to be more non-coherent since the crystal orientation of the antiferromagnetic layer 4 is different from that of the pinned magnetic layer 3.

While the composition range described above makes it possible to obtain an exchange anisotropic magnetic field of at least 400 Oe or more, the composition range of the element X in the X—Mn alloy can be a little widened by forming the antiferromagnetic layer 4 under the pinned magnetic layer 3 than forming the former on the latter.

The composition ratio of the element X' is within the range of 0.2 to 10% by atomic ratio, more preferably within the range of 0.5 to 5% by atomic ratio, when the antiferromagnetic layer 4 is formed of the X—Mn—X' alloy. It is preferable that the composition ratio X:Mn between the element X and Mn is within the range of 4:6 to 6:4.

The composition ratio of X+X' in the X—Mn—X' alloy is within the range of 44 to 57% by atomic ratio, more preferably within the range of 46 to 55% by atomic ratio, in the antiferromagnetic layer 4 formed below the free magnetic layer 1.

The composition ratio of X+X' in the X—Mn—X' alloy is within the range of 47 to 57% by atomic ratio, more preferably within the range of 59 to 56% by atomic ratio, in the antiferromagnetic layer 4 formed over the free magnetic layer 1.

The composition within the range described above allows the difference between the lattice constant of the pinned magnetic layer 3 and the lattice constant of the antiferromagnetic layer 4 before the heat treatment to be large and the interface structure before the heat treatment to be non-coherent. Accordingly, applying a heat treatment makes it possible to transform a part of the crystal structure of the antiferromagnetic layer 4 at the interface from the disordered lattice to the ordered lattice that is required for generating an exchange anisotropic magnetic field.

The pinned magnetic layer 3 is fixed along the Y-direction forming a single magnetic domain by the anisotropic exchange magnetic field in the dual spin-valve type thin film element as in the single spin-valve type thin film element shown in FIG. 1, magnetization of the free magnetic layer 1 being also aligned along the X-direction by being affected by the hard bias layers 5, 5.

A static current is imparted from the conductive layer 8 to the free magnetic layer 1, non-magnetic layer 2 and pinned magnetic layer 3. When a magnetic field is applied from the recording medium along the Y-direction, magnetization of the free magnetic layer 1 is turned from the X-direction to the Y-direction causing scattering of spin-dependent conductive electrons at the interfaces between the non-magnetic conductive layer 2 and free magnetic layer 1 and between the non-magnetic layer 2 and pinned magnetic layer 3 to change electric conductance, thereby sensing the leakage magnetic field from the recording medium.

In contrast to the single spin-valve type thin film element shown in FIG. 1 and FIG. 2 in which spin-dependent electrons are scattered at two sites of the interface between the non-magnetic conductive layer 2 and free magnetic layer 1 and the interface between the non-magnetic layer 2 and pinned magnetic layer 3, the conductive electrons are scattered at four sites of two interfaces between the non-magnetic conductive layer 2 and free magnetic layer 1 and two interfaces between the non-magnetic layer 2 and pinned magnetic layer 3 in the dual spin-valve type thin film element shown in FIG. 3. Therefore, a larger rate of resistance change can be obtained in the dual spin-valve type thin film element than in the single dual spin-valve type thin film element.

Figure 4:
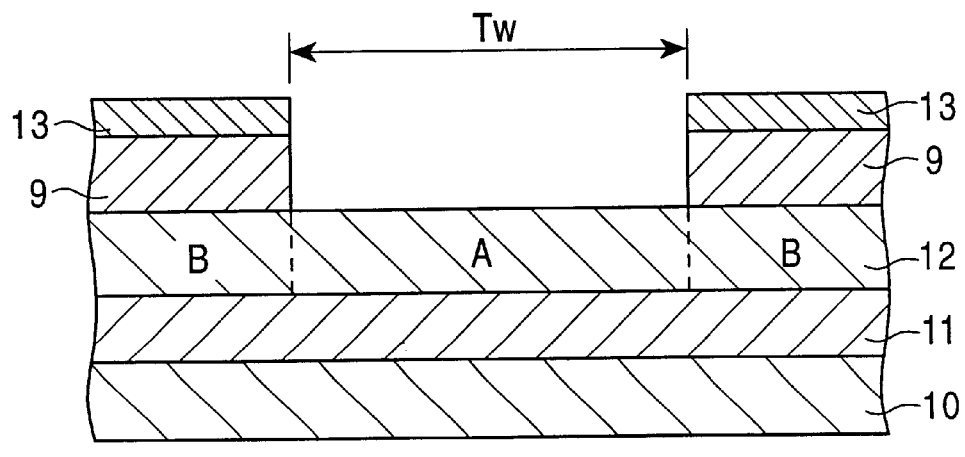
FIG. 4 is a cross section of the structure of the AMR type thin film element according to the fourth embodiment of the present invention viewed from the ABS face side.
Figure 4:
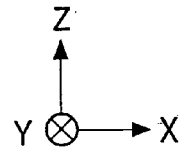

FIG. 4 is a cross section showing the structure of the AMR type thin film element according to the fourth embodiment of the present invention.

As shown in the drawing, a soft magnetic layer (soft adjacent layer: SAL) 10, a non-magnetic layer (SHUNT layer) 11 and a magnetoresistive layer (MR layer) 12 are continuously laminated from the bottom to the top.

For example, the soft magnetic layer 10 is formed of a Fe—Ni—Nb alloy, the non-magnetic layer 11 is formed of a Ta film and the magnetoresistive layer 12 is formed of a NiFe alloy.

An exchange bias layers (antiferromagnetic layers) 9, 9 are formed on the magnetoresistive layer 12 at the both sides along the X-direction remaining a track width Tw. Conductive layers 13, 13 formed of Cr film are formed on the exchange bias layers 9, 9.

The exchange bias layers 9, 9 is formed of the X—Mn alloy, preferably of the PtMn alloy, as in the exchange bias layers 9, 9 shown in FIG. 2. The composition ratio of the element X in the X—Mn alloy is within the range of 47 to 57% by atomic ratio, preferably within the range of 50 to 56% by atomic ratio.

The exchange bias layers 9, 9 are formed of the X—Mn—X' alloy (wherein the element X' is one or two or more kinds of the elements of Ne, Ar, Kr, Xe, Be, B, C, N, Mg, Al, Si, P, Ti, V, Cr, Fe, Co, Ni, Cu, Zn, Ga, Ge, Zr, Nb, Mo, Ag, Cd, Ir, Sn, Hf, Ta, W, Re, Au, Pb and rare earth elements) and the composition ratio of the element X' is within the range of 0.2 to 10% by atomic ratio, preferably within the range of 0.5 to 5% by atomic ratio. It is preferable that the ratio X:Mn of the element X and Mn is within the range of 4:6 to 6:4. The composition ratio of X+X' of the X—Mn—X' alloy in the exchange bias layers 9, 9 shown in FIG. 4 is, like the exchange bias layers 9, 9 shown in FIG. 2, within the range of 47 to 57% by atomic ratio, preferably within the range of 50 to 56% by atomic ratio.

Forming the X—Mn alloy or X—Mn—X' alloy with the composition ratio as described above allows the interface structure between the exchange bias layers 9, 9 and the magnetoresistive layer 12 to be non-coherent. An exchange anisotropic magnetic field of 40 to 110 Oe is obtained by applying a heat treatment when the film thickness of the magnetoresistive layer 12 of the NiFe alloy is 200 to 300 Angstrom. Especially, when the film thickness of the magnetoresistive layer 12 of the NiFe alloy is 200 Angstrom, an exchange anisotropic magnetic field of 200 Oe is obtained and the B region of the magnetoresistive layer 12 shown in FIG. 4 is fixed along the X-direction forming a single magnetic domain. Magnetization of the A region of the magnetoresistive layer 12 is also aligned along the X-direction by being induced by the magnetization of the B region. The current magnetic field generated by the sensing current flowing through the magnetoresistive layer 12 is impressed on the soft magnetic layer along the Y-direction, a lateral bias magnetic field being imparted to the A region of the magnetoresistive layer 12 due to magnetostatic coupling energy. Resistance change as a function of the change of the magnetic field in the A region of the magnetoresistive layer 12 (magnetoresistive effect characteristic: H-R effect characteristic) is set to have linearity by imparting this lateral bias layer to the A region of the magnetoresistive layer 12 fixed along the X-direction forming a single magnetic domain.

While the recording medium travels along the Z-direction, resistance of the A region of the magnetoresistive layer 12 is changed by imparting a leakage magnetic field along the Y-direction, which is sensed as voltage variation.

As hitherto discussed in detail, the interface structure between the antiferromagnetic layer 4 and the pinned magnetic layer 3 (or the free magnetic layer 1 or magnetoresistive layer 12) formed in direct contact with this antiferromagnetic layer 4 can be made to be non-coherent in the present invention by properly adjusting the composition ratio of the antiferromagnetic layer 4 in forming the antiferromagnetic layer 4 (or the exchange bias layer 9) with the X—Mn alloy (wherein X is either one or two or more of the elements of Pt, Pd, Ir, Rh, Ru and Os), preferably with the PtMn alloy, thereby obtaining an larger exchange anisotropic magnetic field and making it possible to improve the reproduction characteristic over the prior art. Otherwise, the lattice constant of the antiferromagnetic layer 4 can be enlarged by adding the element X' (wherein the element X' is one or two or more kinds of the elements of Ne, Ar, Kr, Xe, Be, B, C, N, Mg, Al, Si, P, Ti, V, Cr, Fe, Co, Ni, Cu, Zn, Ga, Ge, Zr, Nb, Mo, Ag, Cd, Ir, Sn, Hf, Ta, W, Re, Au, Pb and rare earth elements) as a third element in the antiferromagnetic layer 4 (or the exchange bias layer 9) in addition to the element X and Mn as compared with the case when the element X' is not added. Accordingly, the interface structure between the antiferromagnetic layer 4 and the pinned magnetic layer 3 (or the free magnetic layer or the magnetoresistive layer 12) formed in direct contact with this antiferromagnetic layer 4 can be made to be non-coherent, thereby obtaining a larger exchange anisotropic magnetic field and making it possible to improve the reproduction characteristic over the prior art.

It is preferable for making the interface structure to be non-coherent that the crystal orientation of the antiferromagnetic layer 4 is different from the crystal orientation of the pinned magnetic layer 3.

Non-coherency of the interface structure enables to obtain exchange anisotropic magnetic field because the heat treatment allows the crystal structure of the antiferromagnetic layer 4 to be transformed from the disordered lattice to the ordered lattice. However, it is preferable to transform a part of the crystal structure is transformed into the ordered lattice since a problem of adhesion is caused when all the crystal structure is transformed into the ordered structure. For example, when the antiferromagnetic layer 4 is formed of the PtMn alloy, it is preferable that the ratio c/a between the lattice constants a and c of the antiferromagnetic layer 4 after the heat treatment is within the range of 0.93 to 0.99 (the ratio c/a between the lattice constants a and c is 0.918 when all the crystal structure transformed into the ordered lattice).

The structure of the magnetoresistive element layer is not always limited to the structure shown in FIG. 1 to FIG. 4 in the present invention. In the single spin-valve type thin film element shown in FIG. 1, for example, the exchange bias layer may be formed under the free magnetic layer 1 with a space apart by the track width Tw without forming the hard bias layers 5, 5. Otherwise, the hard bias layer may be formed on both sides of the six layers from the underlayer 6 to the protective layer 7, or at least on both sides of the free magnetic layer, without forming the exchange bias layers 9, 9 in the single spin-valve type thin film element shown in FIG. 2.

Figure 5:
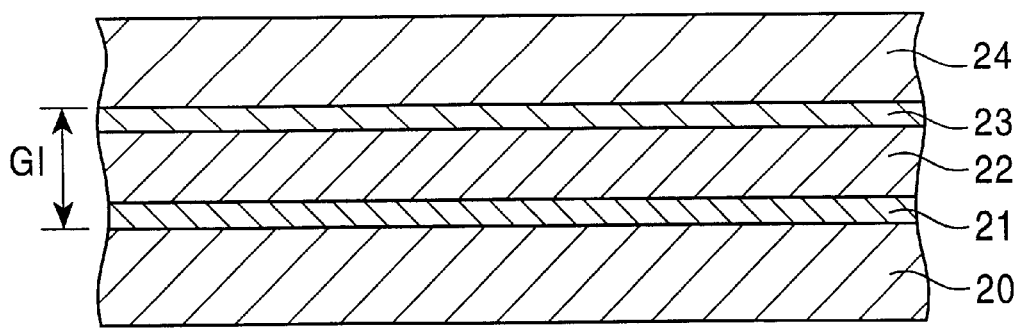
FIG. 5 is a cross section of the thin film magnetic head according to the present invention viewed from the confronting side to the recording medium.

FIG. 5 is a cross section of the reading head, in which the magnetoresistive element layers shown in FIG. 1 to FIG. 4 are formed, viewed from the confronting side to the recording medium.

The reference numeral 20 corresponds to the bottom shield layer formed of, for example, the NiFe alloy and a bottom gap layer 21 is formed on this bottom shield layer 20. The magnetoresistive element layer 22 shown in FIG. 1 to FIG. 4 is formed on the bottom gap layer 21 and the top gap layer 23 is formed on the magnetoresistive element layer 22, the top shield layer 24 formed of the NiFe alloy being formed on the top gap layer 23.

The bottom gap layer 21 and the top gap layer 23 are formed of an insulation material such as $SiO_2$ and $Al_2O_3$ (aluminum oxide). The length from the bottom gap layer 21 to the top gap layer 23 corresponds to the gap length G1. The smaller the gap length is, the head can respond to more higher recording density.

EXAMPLE

Firstly, a multilayer composed of the film construction described below was deposited in the present invention to investigate the relation between the Pt content as one element constituting the antiferromagnetic layer and the lattice constant of the antiferromagnetic layer.

The film was deposited, from the bottom to the top, in the order of; Si substrate/alumina/underlayer: Ta (100)/pinned magnetic layer: NiFe (300)/antiferromagnetic layer: PtMn (300)/Ta (100). The numerals in the parentheses represents the film thickness with Angstrom unit (Å).

The relation between the Pt content and lattice constant of the antiferromagnetic layer was experimentally determined before subjecting to a heat treatment from the peak position in the diffraction pattern by the X-ray diffraction θ/2θ method.

Figure 6:
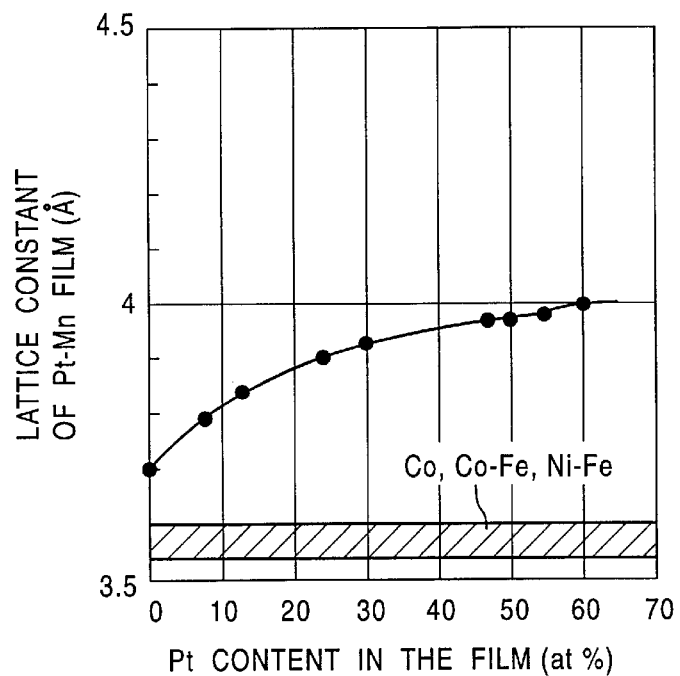
FIG. 6 is a graph showing the relation between the Pt content before the heat treatment and the lattice constant of the antiferromagnetic material when the antiferromagnetic layer is formed of the PtMn alloy.

It is clear from FIG. 6 that the lattice constant of the antiferromagnetic layer (PtMn layer) becomes large as the Pt content is increased. The lattice constant of the NiFe alloy, CoFe alloy, CoFe alloy and Co constituting the pinned magnetic layer is about 3.5 to 3.6 Å.

Then, two multilayers on which or under which the antiferromagnetic layer was formed was deposited by the DC magnetron sputtering method and the relation between the Pt content (one element constituting the antiferromagnetic layer) after subjecting to a heat treatment and exchange anisotropic magnetic field was studied. The results are shown in FIG. 7.

The film construction in which the antiferromagnetic layer is formed under the pinned magnetic layer was deposited is, from the bottom to the top, in the order of; Si substrate/alumina/underlayer: Ta (50)/antiferromagnetic layer: PtMn (300)/pinned magnetic layer: $Co_{90}Fe_{10}$ (30)/protective layer Ta (100). The film construction in which the antiferromagnetic layer is formed on the pinned magnetic layer was deposited is, from the bottom to the top, in the order of; Si substrate/alumina/Ta (50)/pinned magnetic layer: $Co_{90}Fe_{10}$ (30)/antiferromagnetic layer (300)/protective layer: Ta (100). The numerals in the parentheses represents the film thickness with Angstrom unit (Å).

The heat treatment condition was; three hours of temperature increase, then keep the temperature of 240° C. for 3 hours and 3 hours of temperature decrease. The degree of vacuum for the heat treatment was $5\times10^{-6}$ Torr or less.

Figure 7:
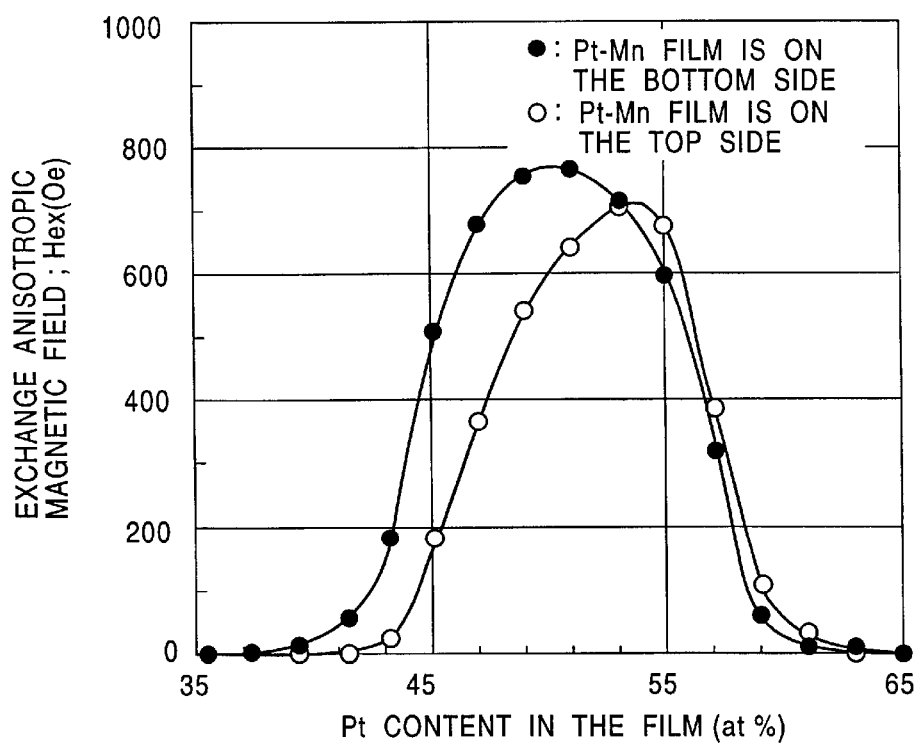
FIG. 7 is a graph showing the relation between the Pt content and exchange anisotropic magnetic field when the antiferromagnetic layer is formed of the PtMn alloy.

It is clear from FIG. 7 that the exchange anisotropic magnetic field is increased as the Pt content is increased up to 50% by atomic ratio but exchange anisotropic magnetic field is gradually decreased when the Pt content is about 50% by atomic ratio or more in both cases when the antiferromagnetic layer (the PtMn alloy layer) is formed on and under the pinned magnetic layer.

It can be understood that, for obtaining an exchange anisotropic magnetic field of 400 Oe or more, the Pt content may be properly adjusted within the range of 44 to 57% by atomic ratio when the antiferromagnetic layer (the PtMn layer) is formed under the pinned magnetic layer while the Pt content may be properly adjusted within the range of 47 to 57% by atomic ratio when the antiferromagnetic layer (the PtMn layer) is formed on the pinned magnetic layer.

It can be understood that, for obtaining an exchange anisotropic magnetic field of 600 Oe or more, the Pt content may be properly adjusted within the range of 46 to 55% by atomic ratio when the antiferromagnetic layer (the PtMn layer) is formed under the pinned magnetic layer while the Pt content may be properly adjusted within the range of 50 to 55% by atomic ratio when the antiferromagnetic layer (the PtMn layer) is formed on the pinned magnetic layer.

Based on the experimental results above, four kinds of multilayers in which the composition ratio of the antiferromagnetic layer (the PtMn layer) was properly adjusted were deposited together with one kind of the multilayer film as a comparative example, and the degree of orientation and exchange anisotropic magnetic field of each film were investigated. The results are shown in TABLE 1.

TABLE 1

|  | Construction of the film | Composition at PtMn (at %) | Lattice coherent at PtMn/Co—Fe interface | (111) orientation of PtMn | (111) orientation at ferromagnetic layer/Cu/ ferromagnetic layer | Degree of order of PtMn after heat treatment at 240° C. | Exchange anisotropic magnetic field Hex (Oe) | Resistivity variation rate (%) |
|---|---|---|---|---|---|---|---|---|
| Example ① | Substrate/Alumina/Ta (30Å)/ PtMn (300Å)/Co—Fe (30Å)/ Cu (22Å)/Co—Fe (10Å)/Ta (50Å) | $Pt_{49}Mn_{51}$ | Non | Medium | Weak | ○ | 770 | 6.7 |
| ② | Substrate/Alumina/PtMn (300 Å)/Co (30Å)/Cu (24Å)/ Ni—Fe (80Å)/Ta (50Å) | $Pt_{50}Mn_{50}$ | Non | Weak | Weak | ○ | 730 | 4.5 |
| ③ | Substrate/Alumina/Ta (50Å)/ Ni—Fe (70Å)/Co—Fe (10Å)/ Cu (28Å)/Co—Fe (30Å)/ PtMn (300Å)/Ta (50Å) | $Pt_{51}Mn_{49}$ | Non | Weak | Strong | ○ | 620 | 5.7 |
| ④ | Substrate/Alumina/Ta (30Å)/ PtMn (200Å)/Co—Fe (30Å)/ Cu (22Å)/Co—Fe (10Å)/Cu (22Å)/Co—Fe (30Å)/PtMn (200Å)/Ta (50Å) | $Pt_{49}Mn_{51}$ | Non | Medium | Weak | ○ | 610 | 9.3 |
| Comparative example ⑤ | The same as ③ | $Pt_{44}Mn_{56}$ | Yes | Strong | Strong | x | 40 | 0.2 |

The multilayer films in the examples 1 to 3 are single spin-valve type thin film elements and the multilayer film in the example 4 corresponds to a dual spin-valve type thin film element. The multilayer film in the comparative example 5 has the same film construction as the multilayer film in the example 3 in which only the composition ratios of the antiferromagnetic layer (the PtMn layer) are different with each other.

The CoFe and Ni—Fe alloys are laminated on the Cu layer (the non-magnetic conductive layer) in the multilayer film in the example 1 and the free magnetic layer is composed of these two layers. Similarly, the Ni—Fe and CoFe alloys are laminated under the Cu layer (the non-magnetic conductive layer) in the multilayer film in the example 3 and the free magnetic layer is composed of these two layers. The CoFe, NiFe and CoFe alloys are laminated between the two Cu layers (non-magnetic conductive layers) in the multilayer film in the example 4 and the free magnetic layer is composed of these layers.

As shown in TABLE 1, although the lattice coherency is not observed at the interface between the PtMn alloy layer (antiferromagnetic layer) and CoFe alloy layer (pinned magnetic layer), coherency at the interface is observed in the multilayer film in the comparative example 5.

With reference to the column entitled "the degree of order of PtMn after heat treatment at 240° C.", the multilayer films in the examples 1 to 4 are evaluated as "○" while the multilayer film in the comparative example 5 is evaluated as "x".

With reference to the columns entitled "exchange anisotropic magnetic field" and "rate of resistance change", the multilayer films in the examples 1 to 4 have large exchange anisotropic magnetic field and rate of resistance change but the exchange anisotropic magnetic field and rate of resistance change in the comparative example 5 are quite smaller than those of the multilayer films in the examples 1 to 4.

These experimental results are related to the composition ratio of the PtMn alloy. As shown in Table 1, the Pt content of the PtMn alloy in the example 1 to 4 is 49 to 51% by atomic ratio as compared with the Pt content of 44% by atomic ratio in the PtMn alloy in the comparative example 5.

With reference to FIG. 6 (before heat treatment), it is clear that the lattice constant of the PtMn alloy in the comparative example 5 is smaller than the lattice constants of the PtMn alloy in the examples 1 to 4, indicating that the difference between the lattice constants of the PtMn layer (antiferromagnetic layer) and the CoFe layer (pinned magnetic layer) is smaller in the comparative example 5 than in the examples 1 to 4.

This means that, in the steps prior to the heat treatment, the interface structure between the PtMn and CoFe layers are easy to be coherent in the multilayer film in the comparative example 5 while the interface structure between the PtMn and CoFe layers are ready to be non-coherent in the multilayer films in the examples 1 to 4.

Although the crystal structures in the examples 1 to 4 and in the comparative example 5 assume disordered lattices (face-centered tetragonal lattices) before the heat treatment, the crystal structure of the PtMn layer can not be transformed from the disordered lattice to the ordered lattice even when a heat treatment is applied in the comparative example 5 in which the interface structure is made to be coherent, thereby ordering can be hardly proceeded.

On the contrary, a part of the crystal structure of the PtMn layer is transformed from the disordered lattice to the ordered lattice by applying a heat treatment in the examples 1 to 4 in which the interface structure is made to be non-coherent, thereby ordering can be sufficiently proceeded.

Figure 8:
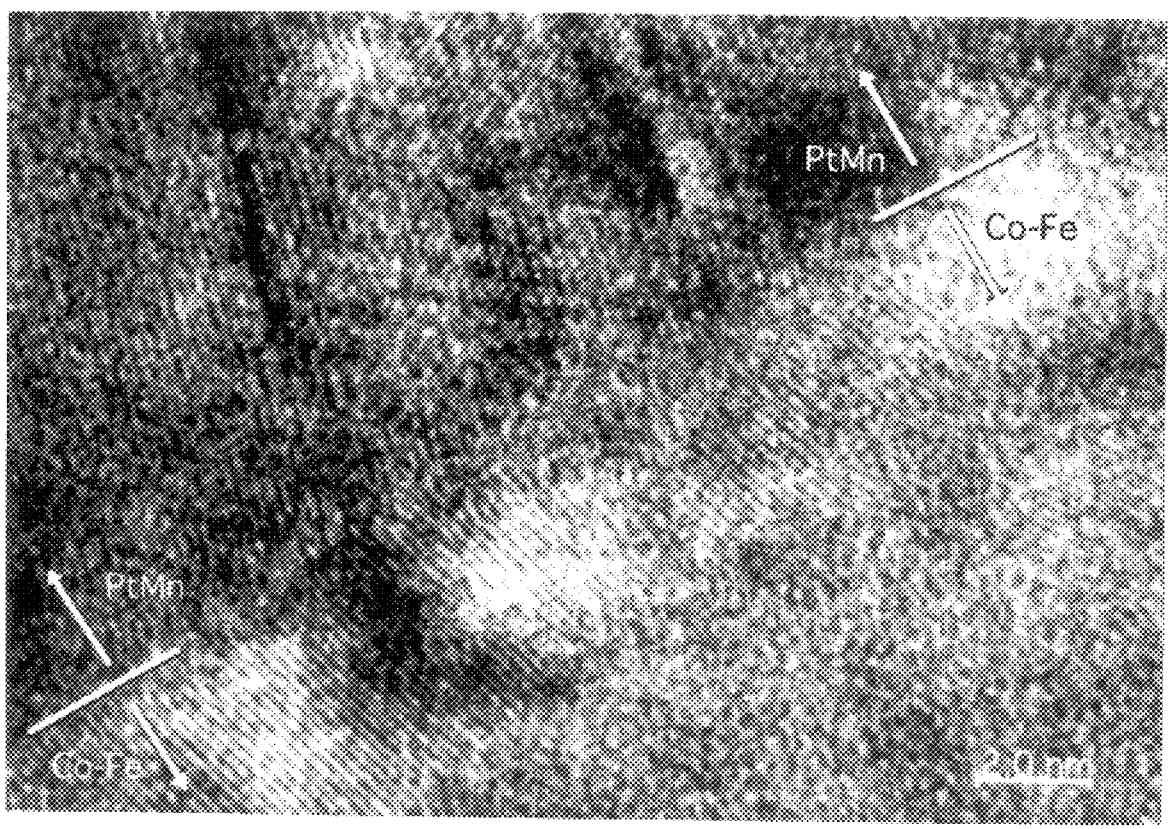
FIG. 8 is a high resolution TEM photograph of the multilayer film in the example 3 shown in TABLE 1.

FIG. 8 is the high resolution TEM (Transmission Electron Microscopy) photograph showing the interface structures of the PtMn layer and CoFe layer after the heat treatment in the example 3.

As shown in FIG. 8, the alignment direction of PtMn atoms does not match with the alignment direction of CoFe atoms at the interface between the PtMn layer and CoFe layer forming a non-coherent lattice.

Figure 9:
FIG. 9 is a high resolution TEM photograph of the multilayer film in the comparative example shown in TABLE 1.

FIG. 9 is the high resolution TEM (Transmission Electron Microscopy) photograph showing the interface structures of the PtMn layer and CoFe layer after the heat treatment in the comparative example 5.

The alignment direction of the PtFe atoms matches with the alignment direction of the CoFe atoms at the interface between the PtFe and CoFe layers as shown in FIG. 9, showing coherent relation with each other.

Figure 10:
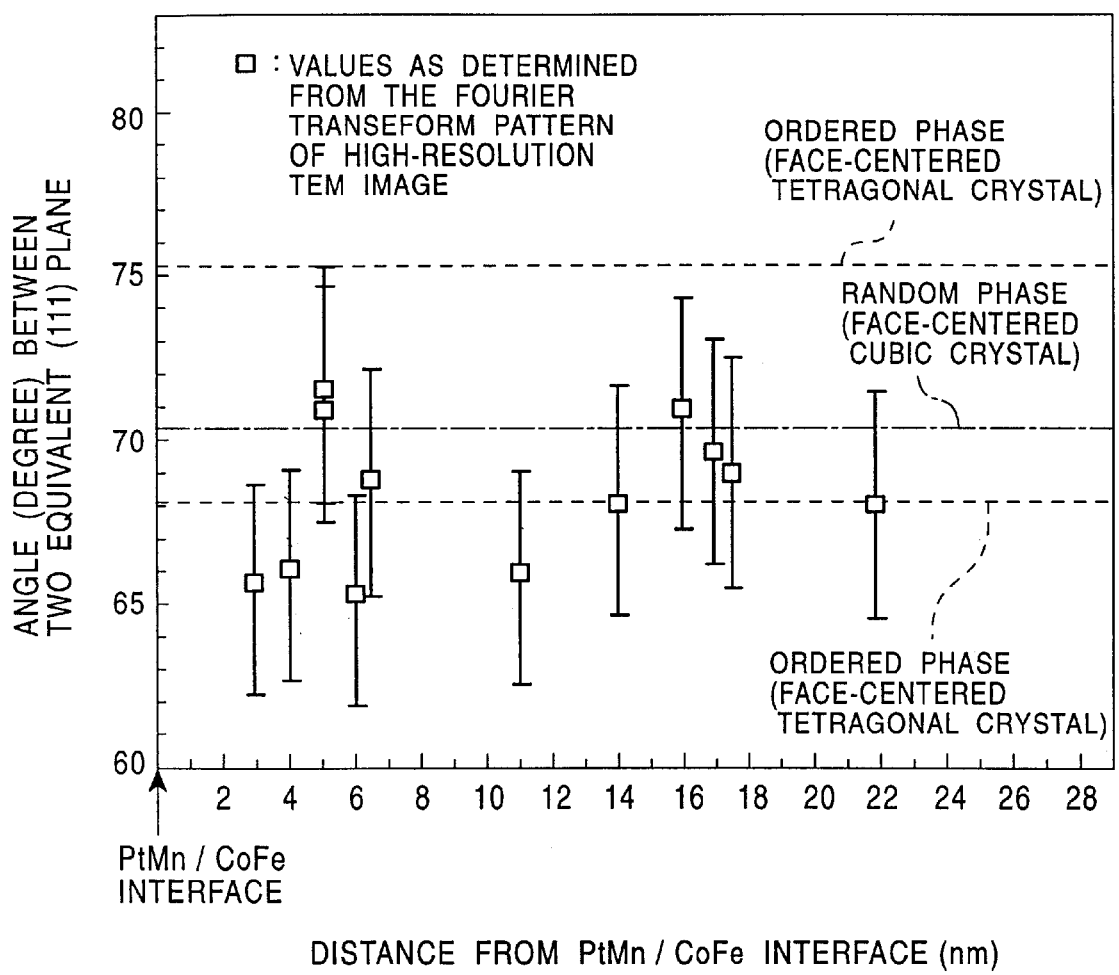
FIG. 10 is a graph showing the degree of ordering of the PtMn layer (antiferromagnetic layer) of the multilayer film in the example 3 shown in TABLE 1.
Figure 11:
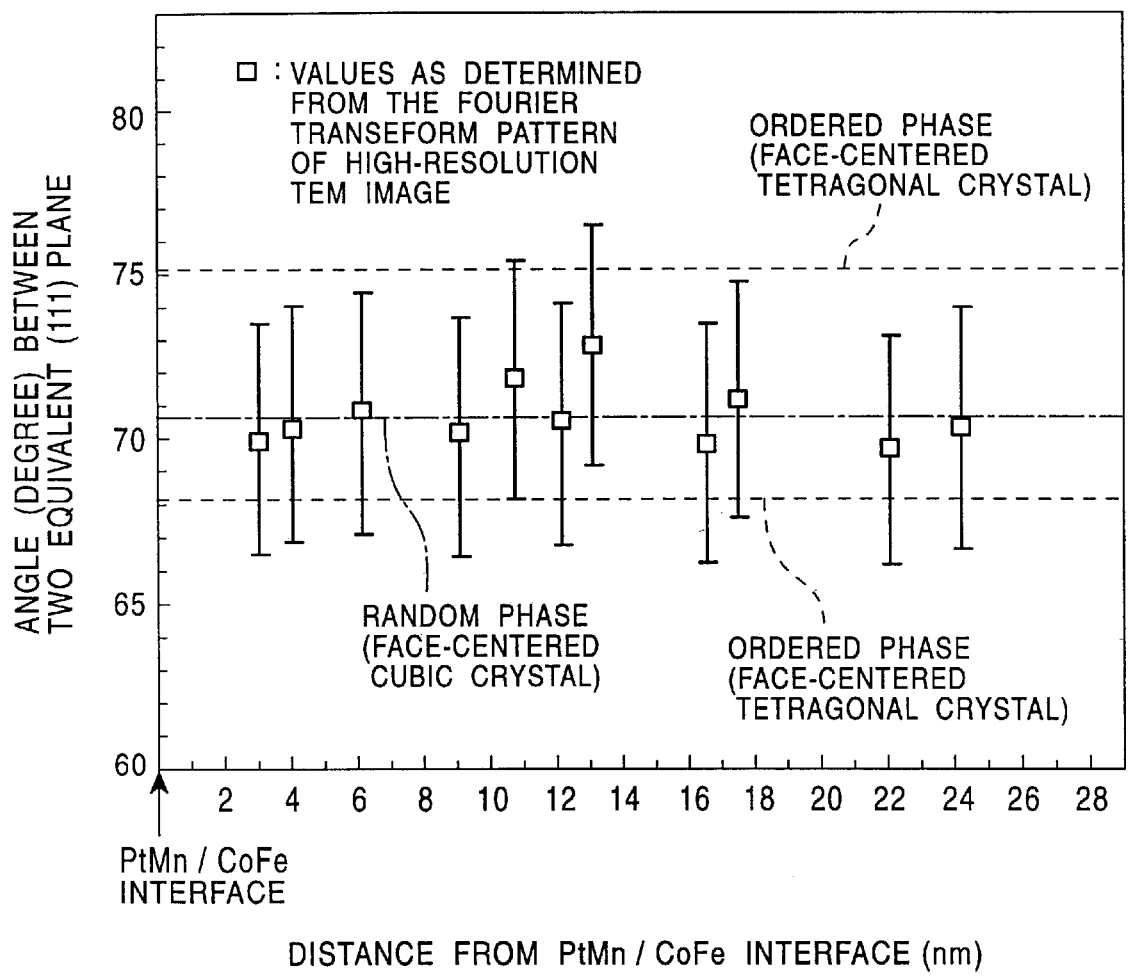
FIG. 11 a graph showing the degree of ordering of the PtMn layer (antiferromagnetic layer) of the multilayer film in the example 5 shown in TABLE 1.

FIG. 10 shows the degree of ordering of the PtMn atoms in the multilayer film in the example 3 while FIG. 11 shows the experimental results of measurements of the degree of ordering of the PtMn atoms in the multilayer film in the comparative example 5.

The angle between the two equivalent {111} planes in the PtMn alloy was measured in the experiment and the degree of ordering was determined from the angle between the two planes. The horizontal axis corresponds to the distance from the interface between the PtMn and CoFe planes to the PtMn plane side.

As shown in FIG. 10, the angle between the {111} planes are distributed within the angles of about 65° to 72°, indicating that a part of the disordered lattice before the heat treatment was transformed into an ordered lattice in the crystal structure of the PtMn layer.

In contrast to the observation above, the measured angles between the {111} planes are concentrated within the range of about 80 to 71°, showing that the crystal structure of the PtMn layer remains to be the disordered lattice before the heat treatment even after the heat treatment.

As hitherto described, the interface structure can be non-coherent by adjusting the Pt content of the PtMn layer to 49 to 51% by atomic ratio in the multilayer film in the examples 1 to 4, thereby allowing to properly proceed ordering. Therefore, the exchange anisotropic magnetic field generated at the interface between the PtMn and CoFe layers has a very large value as seen in FIG. 7.

In the multilayer film in the comparative example 5, on the other hand, the Pt content of the PtMn layer is as low as 44% by atomic ratio that the interface structure becomes coherent. Accordingly, ordering is not proceeded to result in a very small exchange anisotropic magnetic field generated at the interface between the PtMn and CoFe layers as is evident from FIG. 7.

It is preferable that the crystal orientation of the PtMn layer is different from the crystal orientation of the CoFe layer in order to allow the interface structure between the PtMn and CoFe layers to be non-coherent.

The terms "strong", "medium" and "weak" with respect to the degree of orientation of the {111} plane shown in TABLE. 1 represent the degree of preferred orientation along the film face direction.

As shown in TABLE 1, both of the degree of orientation of the {111} plane of the PtMn layer in the comparative example 5 and the degree of orientation of the {111} plane of the CoFe layer (pinned magnetic layer) in the comparative example 5 are evaluated to be "strong".

Referring to the construction of the film in the example 3, the {111} planes of the NiFe layer, CoFe layer (free magnetic layer), Cu layer (non-magnetic conductive layer) and CoFe layer (pinned magnetic layer) formed on Ta layer are strongly oriented by being strongly affected by the Ta layer as an underlayer. It is evident with reference to FIG. 6 that the {111} plane of the PtMn layer is preferentially oriented along the film face direction under the strong influence of the degree of orientation of the {111} plane of the CoFe alloy since the difference between the lattice constant of the CoFe layer (pinned magnetic layer) and the lattice constant of the PtMn layer (antiferromagnetic layer) before the heat treatment is small.

On the contrary, although the {111} planes of the NiFe layer, CoFe layer (free magnetic layer), Cu layer (non-magnetic conductive layer) and CoFe layer (pinned magnetic layer) formed on the Ta layer are strongly oriented under the strong influence of the Ta layer as an underlayer, it is evident from FIG. 6 that the {111} plane of the PtMn layer is not strongly influenced by the crystal orientation of the CoFe layer to weaken the degree of orientation along the film face direction because the difference between the lattice constant of the CoFe layer (pinned magnetic layer) and the lattice constant of the PtMn layer (antiferromagnetic layer) is large.

In the examples 1 and 2 in which the CoFe layer (pinned magnetic layer) is laminated on the PtMn layer, the degree of orientation of the {111} plane of the CoFe layer is weakened by forming the CoFe layer on the PtMn layer, thereby the crystal orientations of the PtMn layer and CoFe layer are automatically directed along different directions.

The relation between the content of the element X' and the lattice constant of the Pt—Mn—X' alloy was then investigated in the present invention after forming the antiferromagnetic layer with the Pt—Mn—X' alloy (X'=Ar). The film construction used in the experiment was; Si substrate/alumina/Ta (50)/Co$_{90}$Fe$_{10}$ (30)/Pt—Mn—X' (300)/Ta (100) from the bottom to the top. The numerals in the parentheses represents the film thickness with Angstrom unit (Å).

For depositing the antiferromagnetic layer, three kinds of targets with the Pt/Mn ratio of 6:4, 5:5 and 4:6 were placed in the sputtering apparatus. A film of the Pt—Mn—X'(X'=Ar) alloy was deposited using respective targets under various introduction gas (Ar as the element x') pressure by a DC magnetron sputtering method and ion beam sputtering method. The relation between the content of X' (X'=Ar) occupying in the film of the Pt—Mn—X' (X'=Ar) alloy and lattice constant of the Pt—Mn—X' (X'=Ar) alloy was measured. The results are shown in FIG. 12.

Figure 12:
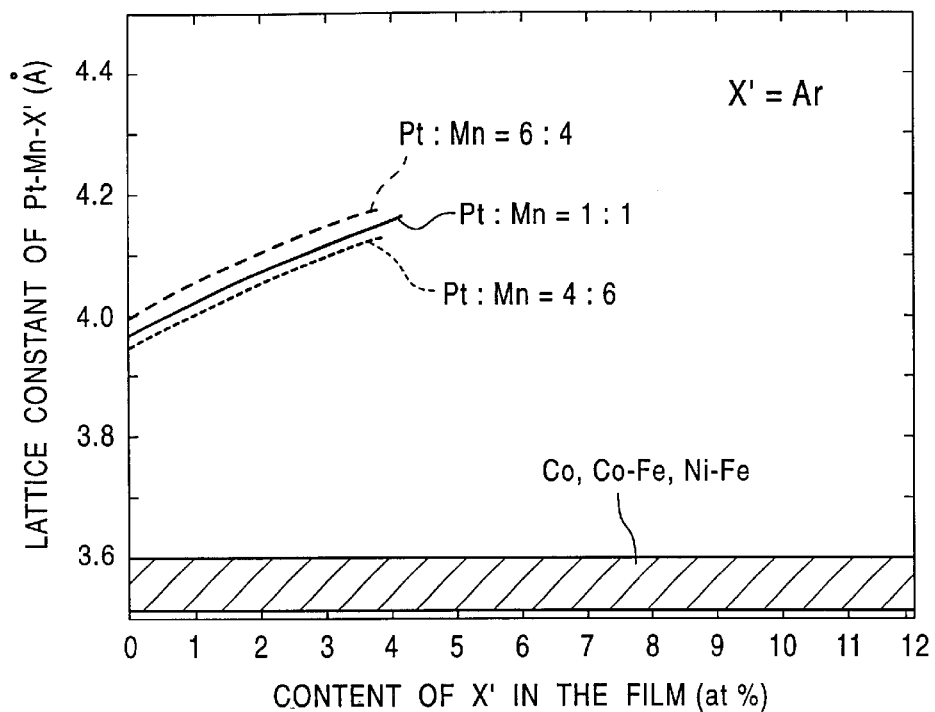
FIG. 12 is a graph showing the relation between the content of the element X' (X'=Ar) and the lattice constant of the antiferromagnetic layer when the antiferromagnetic layer is formed of the Pt—Mn—X' (X'=Ar) alloy.

FIG. 12 shows that The lattice constant of the Pt—Mn—X' alloy (X'=Ar) becomes large by increasing the content of the element X' (X'=Ar) in any cases where the composition ratio between Pt and Mn is 6:4, 5:5 or 4:6. The lattice constant of the NiFe alloy, CoFe alloy or Co constituting the pinned magnetic layer is within the range of about 3.5 to 3.6 Å. The content of the element X' (X'=Ar) was increased up to 4% by atomic ratio in this experiment and any experiments for further increasing the content were not attempted because, since Ar to be used for the element X' is a gas element, Ar is hardly incorporated into the film even when the gas pressure was increased.

The Pt—Mn—X' (X'=Ar) used in the experiment above was then subjected to a heat treatment process described below. The heat treatment conditions were; three hours for temperature increase, 3 hours for keeping the temperature of 240° C. and three hours for temperature decrease. The degree of vacuum for the heat treatment was $5 \times 10^{-6}$ Torr or less.

Figure 13:
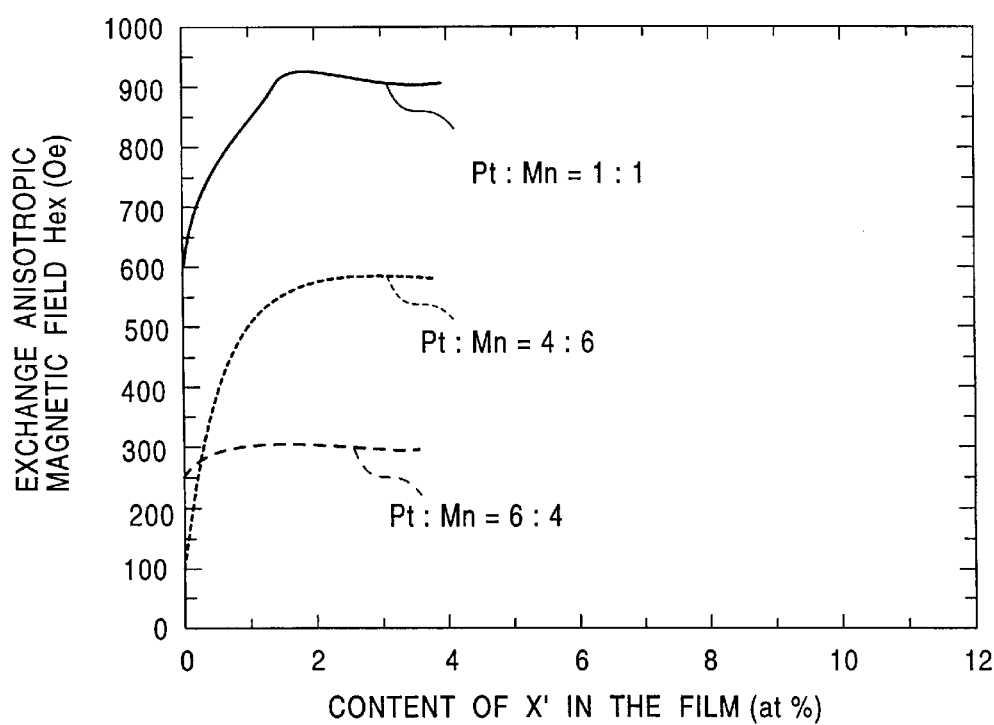
FIG. 13 is a graph showing the relation between the content of the element X' (X'=Ar) and the exchange coupling magnetic field when the antiferromagnetic layer is formed of the Pt—Mn—X' (X'=Ar) alloy.

FIG. 13 is a graph showing the relation between the content of the element X' (X'=Ar) in the Pt—Mn—X'(X'=Ar) alloy and the level of the exchange coupling magnetic field generated at the inter face between the antiferromagnetic layer and pinned magnetic layer.

As shown in FIG. 13, it is made clear that the larger the content of the element X' (X'=Ar), the more the exchange coupling magnetic field is increased. This means that larger exchange coupling magnetic field can be obtained by adding the element X' (X'=Ar) in the PtMn alloy as compared with the exchange coupling magnetic field when no element X' (X'=Ar) is added.

The antiferromagnetic layer was separately formed of the Pt—Mn—X' (X'=Mo) in the present invention using a different element X' to investigate the relation between the content of the element X' (X'=Mo) and the lattice constant of the Pt—Mn—X' (X'=Mo) alloy. The film construction used in the experiment was; Si substrate/alumina/Ta (50)/ $Co_{90}Fe_{10}$ (30)/Pt—Mn—X'(300)/Ta (100) from the bottom to the top. The numerals in the parentheses represents the film thickness with Angstrom unit (Å).

A complex type target in which a tip of the element X' (X'=Mo) was pasted on a PtMn target was prepared for depositing the antiferromagnetic layer. The relation between the content of the element X' (X'=Mo) and the lattice constant of the Pt—Mn—X' (X'=Mo) alloy was determined by varying the area ratio of the tip on the target with a varying amount of the element X' (X'=Mo) in the target. The experimental results are shown in FIG. 14.

Figure 14:
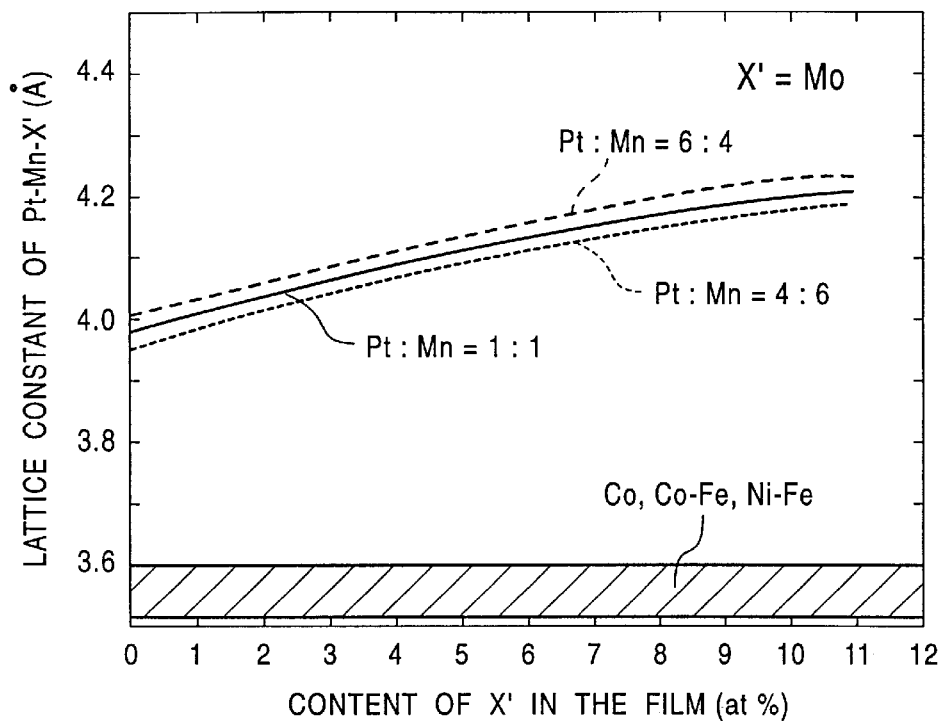
FIG. 14 is a graph showing the relation between the content of the element X' (X'=Mo) and the lattice constant of the antiferromagnetic layer when the antiferromagnetic layer is formed of the Pt—Mn—X' (X'=Mo) alloy.

The results in FIG. 14 indicate that the larger the concentration of the element X' (X'=Mo) in the film is, the more the lattice constant of the Pt—Mn—X' (X'=Mo) alloy is increased in any cases where the composition ratios between Pt and Mn is 6:4, 5:5 or 4:6. The lattice constants of the NiFe alloy, CoFe alloy and Co constituting the pinned magnetic layer are in the range of about 3.5 to 3.6 as shown in FIG. 14.

The Pt—Mn—X' (X'=Mo) used in the experiment above was then subjected to a heat treatment process described below. The heat treatment conditions were; three hours for temperature increase, 3 hours for keeping the temperature of 240° C. and three hours for temperature decrease. The degree of vacuum for the heat treatment was $5 \times 10^{-6}$ Torr or less.

Figure 15:
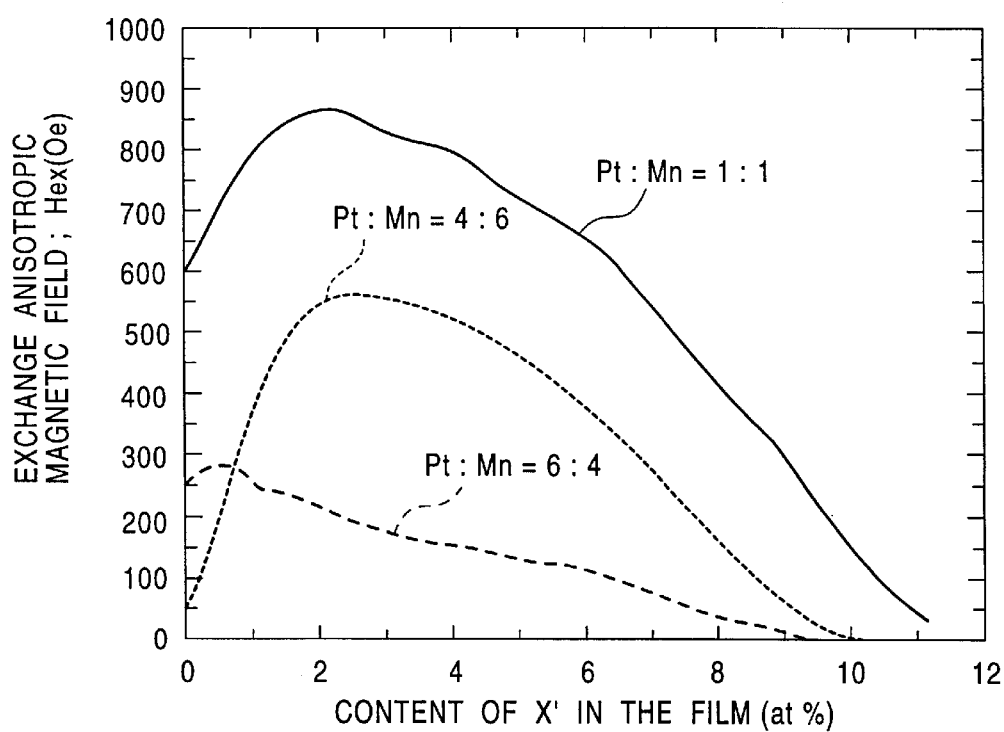
FIG. 15 is a graph showing the relation between the content of the element X' (X'=Mo) and the exchange coupling magnetic field when the antiferromagnetic layer is formed of the Pt—Mn—X' (X'=Mo) alloy.

FIG. 15 is a graph showing the relation between the content of the element X' (X'=Mo) in the film of the Pt—Mn—X' (X'=Mo) alloy and the level of the exchange coupling magnetic field generated at the inter face between the antiferromagnetic layer and pinned magnetic layer.

It is evident from FIG. 15 that the exchange coupling magnetic field is slowly decreased at the content of the element X' (X'=Mo) of about 3% or more by atomic ratio in the film in any cases where the composition ratio between Pt and Mn is 6:4, 1:1 or 4:6. Especially, it is not preferable that the content of the element X'(X'=Mo) is about 10% by atomic ratio or more because, even when the composition ratio between Pt and Mn is 1:1, the exchange coupling magnetic field becomes very small.

As for the proper content of the element X' (X'=Mo), it is preferable that the exchange coupling magnetic field is more increased than the case where no element X' (X'=Mo) is contained, or when the content of the element X'(X'=Mo) is zero in atomic percentage.

When the composition ratio Mn:Pt is 6:4, the exchange coupling magnetic field is more increased than the case when the content of the element X' (X'=Mo) is zero in atomic percentage, provided that the content of the element X' (X'=Mo) is 1% by atomic ratio or less.

When the composition ratio Mn:Pt is 1:1, the exchange coupling magnetic field is more increased than the case when the content of the element X' (X'=Mo) is zero in atomic percentage, provided that the content of the element X' (X'=Mo) is 7% by atomic ratio or less.

When the composition ratio Pt:Mn is 4:6, the exchange coupling magnetic field is more increased than the case when the content of the element X' (X'=Mo) is zero in atomic percentage, provided that the content of the element X' (X'=Mo) is 10% by atomic ratio or less.

As for the lower limit of the proper content of the element X' (X'=Mo), the exchange coupling magnetic field is increased at the content of the element X' 0(X'=Mo) of about 0.5% by atomic ratio when the composition ratio Pt:Mn is 6:4. Accordingly, the lower limit of the content of the element X' (X'=Mo) was determined to be smaller than 0.5% by atomic ratio, or 0.2% by atomic ratio.

The preferable range of the element X' was determined to be 0.2 to 10% by atomic ratio in the present invention from the experimental results. The more preferable range is 0.5 to 5% by atomic ratio.

The preferable composition range of the element X' as described above is valid only when the ratio between Pt (the element X) and Mn is limited within the range of 4:6 to 6:4.

As hitherto described in detail, when the antiferromagnetic layer is formed of a X—Mn alloy (wherein X is either one or two or more of the elements of Pt, Pd, Ir, Rh, Ru and Os) in the exchange coupling film composed of antiferromagnetic layers and ferromagnetic layers, the interface structure between the antiferromagnetic layer and ferromagnetic layer is allowed to be non-coherent by properly adjusting the composition ratio of the antiferromagnetic layer, thereby enabling to obtain a larger exchange magnetic field.

Otherwise, the interface structure between the antiferromagnetic layer and ferromagnetic layer (for example NiFe alloy) is allowed to be non-coherent by forming an invasion type solid solution or substitution type solid solution of the element X' (wherein the element X' is one or two or more kinds of the elements of Ne, Ar, Kr, Xe, Be, B, C, N, Mg, Al, Si, P, Ti, V, Cr, Fe, Co, Ni, Cu, Zn, Ga, Ge, Zr, Nb, Mo, Ag, Cd, Ir, Sn, Hf, Ta, W, Re, Au, Pb and rare earth elements).

It is preferable for obtaining a larger exchange anisotropic magnetic field that at least a part of the crystal structure of the antiferromagnetic layer assumes a $L1_0$ type face-centered orthogonal lattice (an ordered lattice) in the heat treatment step along with the ratio c/a between the lattice constants a and c being within the range of 0.93 to 0.99.

It is also preferable for allowing the interface structure to be non-coherent that the crystal orientation of the antiferromagnetic layer is different from the crystal orientation of the ferromagnetic layer at the inter face between them.

As hitherto described, the rate of resistance change of the magnetoresistive element layer can be enhanced as well as improving the reproduction characteristic by applying the exchange coupling film whose interface structure is allowed to be non-coherent to the magnetoresistive element.

What is claimed are:

1. An exchange coupling film in which an antiferromagnetic layer is formed in direct contact with a ferromagnetic layer, an exchange anisotropic magnetic field is generated at the interface between the antiferromagnetic layer and ferromagnetic layer and the magnetization direction of said ferromagnetic layer is fixed along a prescribed direction,
   wherein said antiferromagnetic layer is formed of an antiferromagnetic material containing:
     at least one element X selected from the group consisting of Pt, Pd, Ir, Rh, Ru and Os; and
     Mn, and
   the interface structure between said antiferromagnetic layer and said ferromagnetic layer being non-coherent.

2. An exchange coupling film according to claim 1, wherein at least a part of the crystal structure of the antiferromagnetic layer after the heat treatment assumes a face-centered tetragonal ordered lattice.

3. An exchange coupling film according to claim 1, wherein crystal orientation of the antiferromagnetic layer is different from the crystal orientation of the ferromagnetic layer at the interface between said antiferromagnetic layer and ferromagnetic layer.

4. An exchange coupling film according to claim 1, wherein the antiferromagnetic layer is formed of a X—Mn alloy, the element X being Pt.

5. An exchange coupling film according to claim 1, wherein the antiferromagnetic layer is formed of a X—Mn—X' alloy, said X—Mn—X' being a solid solution in which the element X' invades into interstices in the space lattice composed of the elements X and Mn, or a solid solution in which a part of the lattice points of the crystal lattice composed of the element X and Mn is substituted with the element X'.

6. An exchange coupling film according to claim 1, wherein the antiferromagnetic layer is formed of a X—Mn alloy, said antiferromagnetic layer being formed on the ferromagnetic layer with the composition ratio of X in the X—Mn alloy of within the range of 47 to 57% by atomic ratio.

7. An exchange coupling film according to claim 1, wherein the antiferromagnetic layer is formed of a X—Mn alloy, said antiferromagnetic layer being formed under the ferromagnetic layer with the composition ratio of X in the X—Mn alloy of within the range of 47 to 57% by atomic ratio.

8. A magnetoresistive element having an antiferromagnetic layer, a pinned magnetic layer formed in direct contact with this antiferromagnetic layer in which magnetization direction is fixed by an exchange anisotropic magnetic field with said antiferromagnetic layer, a free magnetic layer formed over or under said pinned magnetic layer via a non-magnetic conductive layer, a bias layer for aligning the magnetization direction of said free magnetic layer along the direction to cross with the magnetization direction of said pinned magnetic layer and a conductive layer for imparting a sensing current to the pinned magnetic layer and non-magnetic conductive layer; wherein said antiferromagnetic layer and pinned magnetic layer formed in direct contact with this antiferromagnetic layer are formed of the exchange coupling film according to claim 1.

9. A magnetoresistive element according to claim 8, wherein the antiferromagnetic layer is laminated on the top or bottom sides of said free magnetic layer with a space apart by a track width Tw, said antiferromagnetic layer and free magnetic layer being formed of the exchange coupling film according to claim 1.

10. A magnetoresistive element having non-magnetic conductive layers laminated on the top and bottom faces of the free magnetic layer, pinned magnetic layers being situated on the top face of one of the non-magnetic conductive layer and under the bottom face of the other non-magnetic conductive layer, antiferromagnetic layers being situated on the top face of one of the pinned magnetic layer and on the bottom face of the other pinned magnetic layer to fix magnetization directions of respective pinned magnetic layers along a prescribed direction by an exchange anisotropic magnetic field, and a bias layer for aligning the magnetization direction of said free magnetic layer along the direction to cross with the magnetization direction of said pinned magnetic layer, said antiferromagnetic layer and said pinned magnetic layer formed in direct contact with this antiferromagnetic layer being formed of the exchange coupling film according to claim 1.

11. A magnetoresistive element having a magnetoresistive layer and a soft magnetic layer laminated via a non-magnetic layer, wherein an antiferromagnetic layer is formed on the top or bottom side of said magnetoresistive layer with a space apart by a tack width Tw, said antiferromagnetic layer and magnetoresistive layer being formed of the exchange coupling film according to claim 1.

12. An exchange coupling film according to claim 2, wherein crystal orientations in said antiferromagnetic layer and ferromagnetic layer are different with each other at the interface between the antiferromagnetic layer and ferromagnetic layer.

13. An exchange coupling film according to claim 2, wherein the antiferromagnetic layer is formed of the X—Mn alloy and the element X is Pt.

14. An exchange coupling film according to claim 2, wherein the antiferromagnetic layer is formed of a X—Mn—X' alloy, said X—Mn—X' alloy being a solid solution in which the element X' invades into interstices of the space lattice composed of the element X and Mn, or being a solid solution in which a part of the lattice points of the crystal lattice composed of the element X and Mn are substituted with the element X'.

15. An exchange coupling film according to claim 3, wherein the degree of orientation of the {111} plane of the antiferromagnetic layer is lower than the degree of orientation of the ferromagnetic layer, or the {111} plane is non-oriented, and the {111} plane of said ferromagnetic layer being preferentially oriented along the direction parallel to the interface with said antiferromagnetic layer.

16. An exchange coupling film according to claim 3, wherein the degree of orientation of the {111} plane of the ferromagnetic layer is lower than the degree of orientation of the antiferromagnetic layer or the plane is non-oriented in contrast to the {111} plane of said antiferromagnetic layer being preferentially oriented along the direction parallel to the interface with said ferromagnetic layer.

17. An exchange coupling film according to claim 3, wherein both of the degree of orientation of the {111} plane of the antiferromagnetic layer along the direction parallel to the interface between said antiferromagnetic layer and ferromagnetic layer and the degree of orientation of the {111} plane of said ferromagnetic layer are low or the both planes are non-oriented, the crystal planes except said {111} planes being preferentially oriented along the direction parallel to the interface with different crystal orientations between the antiferromagnetic layer and ferromagnetic layer.

18. An exchange coupling film according to claim 3, wherein the antiferromagnetic layer is formed of the X—Mn alloy and the element X is Pt.

19. An exchange coupling film according to claim 3, wherein the antiferromagnetic layer is formed of a X—Mn—X' alloy, said X—Mn—X' being a solid solution in which the element X' invades into interstices in the space lattice composed of the elements X and Mn, or a solid solution in which a part of the lattice points of the crystal lattice composed of the element X and Mn is substituted with the element X'.

20. An exchange coupling film according to claim 4, wherein the antiferromagnetic layer is formed of the PtMn alloy, the ratio (c/a) of the lattice constant a to the lattice constant c of said antiferromagnetic layer after the heat treatment being within the range of 0.93 to 0.99.

21. An exchange coupling film according to claim 4, wherein the antiferromagnetic layer is formed of the X—Mn alloy, said antiferromagnetic layer being formed on the ferromagnetic layer with the composition ratio of X in the X—Mn alloy of within the range of 47 to 57% by atomic ratio.

22. An exchange coupling film according to claim 4, wherein the antiferromagnetic layer is formed of the X—Mn alloy, said antiferromagnetic layer being formed under the ferromagnetic layer with the composition ratio of X in the X—Mn alloy of within the range of 44 to 57% by atomic ratio.

23. An exchange coupling film according to claim 5, wherein the element X in the X—Mn—X' alloy to be used for the antiferromagnetic layer is Pt.

24. An exchange coupling film according to claim 5, wherein the element X' is at least one element selected from the group consisting of Ne, Ar, Kr, Xe, Be, B, C, N, Mg, Al, Si, P, Ti, V, Cr, Fe, Co, Ni, Cu, Zn, Ga, Ge, Zr, Nb, Mo, Ag, Cd, Ir, Sn, Hf, Ta, W, Re, Au, Pb and rare earth elements.

25. An exchange coupling film according to claim 5, wherein the composition ratio (X:Mn) between the element X and Mn is within the range of 4:6 to 6:4.

26. An exchange coupling film according to claim 5, wherein the antiferromagnetic layer is formed of the X—MnX' alloy and X' is at least one element selected from the group consisting of Ne, Ar, Kr, Xe, Be, B, C, N, Mg, Al, Si, P, Ti, V, Cr, Fe, Co, Ni, Cu, Zn, Ga, Ge, Zr, Nb, Mo, Ag, Cd, Ir, Sn, Hf, Ta, W, Re, Au, Pb and rare earth elements, the composition ratio of X+X' in the X—Mn—X' alloy being within the range of 47 to 57% by atomic ratio.

27. An exchange coupling film according to claim 5, wherein the antiferromagnetic layer is formed of the X—Mn—X' alloy and X' is at least one element selected from the group consisting of Ne, Ar, Kr, Xe, Be, B, C, N, Mg, Al, Si, P, Ti, V, Cr, Fe, Co, Ni, Cu, Zn, Ga, Ge, Zr, Nb, Mo, Ag, Cd, Ir, Sn, Hf, Ta, W, Re, Au, Pb and rare earth elements, said antiferromagnetic layer being formed under the ferromagnetic layer and the composition ratio of X+X' in the X—Mn—X' alloy being within the range of 47 to 57% by atomic ratio.

28. An exchange coupling film according to claim 6, wherein the composition ratio of X in the X—Mn alloy or the composition ratio of X+X' in the X—Mn—X' alloy is within the range of 50 to 56% by atomic ratio.

29. An exchange coupling film according to claim 7, wherein the composition ratio of X in the X—Mn alloy or the composition ratio of X+X' in the X—Mn—X' alloy is within the range of 46 to 55% by atomic ratio.

30. A magnetoresistive element according to claim 8, wherein the antiferromagnetic layer is formed on the top or bottom face of the free magnetic layer with a space apart by a tack width Tw, said antiferromagnetic layer and free magnetic layer being formed of the exchange coupling film according to any one of claim 1 or claim 22.

31. A magnetic head in which shield layers are formed on the top and bottom faces of the magnetoresistive element according to claim 8 via gap layers.

32. A magnetic head in which shield layers are formed on the top and bottom faces of the magnetoresistive element according to claim 9 via gap layers.

33. A magnetic head in which shield layers are formed on the top and bottom faces of the magnetoresistive element according to claim 10 via gap layers.

34. A magnetic head in which shield layers are formed on the top and bottom faces of the magnetoresistive element according to claim 11 via gap layers.

35. An exchange coupling film according to claim 12, wherein the degree of orientation of the {111} plane of the antiferromagnetic layer is lower than the degree of orientation of the ferromagnetic layer or the plane is non-oriented in contrast to the {111} plane of said ferromagnetic layer being preferentially oriented along the direction parallel to the interface with said antiferromagnetic layer.

36. An exchange coupling film according to claim 12, wherein the degree of orientation of the {111} plane of the ferromagnetic layer is lower than the degree of orientation of the antiferromagnetic layer or the plane is non-oriented in contrast to the {111} plane of said antiferromagnetic layer being preferentially oriented along the direction parallel to the interface with said ferromagnetic layer.

37. An exchange coupling film according to claim 12, wherein both of the degree of orientation of the {111} plane of the antiferromagnetic layer along the direction parallel to the interface between said antiferromagnetic layer and ferromagnetic layer and the degree of orientation of the {111} plane of said ferromagnetic layer are low or the both planes are non-oriented, the crystal planes except said {111} planes being preferentially oriented along the direction parallel to the interface with different crystal orientations between the antiferromagnetic layer and ferromagnetic layer.

38. An exchange coupling film according to claim 12, wherein the antiferromagnetic layer is formed of the X—Mn alloy and the element X is Pt.

39. An exchange coupling film according to claim 12, wherein the antiferromagnetic layer is formed of the X—Mn—X' alloy, said X—Mn—X' alloy being a solid solution in which the element X' invades into interstices of the space lattice composed of the element X and Mn, or being a solid solution in which a part of the lattice points of the crystal lattice composed of the element X and Mn are substituted with the element X'.

40. An exchange coupling film according to claim 13, wherein the antiferromagnetic layer is formed of the PtMn alloy, the ratio (c/a) of the lattice constant a to the lattice constant c of said antiferromagnetic layer after the heat treatment being within the range of 0.93 to 0.99.

41. An exchange coupling film according to claim 13, wherein the antiferromagnetic layer is formed of the X—Mn alloy, said antiferromagnetic layer being formed over the ferromagnetic layer with the composition ratio of X in the X—Mn alloy of within the range of 47 to 57% by atomic ratio.

42. An exchange coupling film according to claim 13, wherein the antiferromagnetic layer is formed of the X—Mn alloy, said antiferromagnetic layer being formed under the ferromagnetic layer with the composition ratio of X in the X—Mn alloy of within the range of 47 to 57% by atomic ratio.

43. An exchange coupling film according to claim 14, wherein the element in the X—Mn—X' alloy to be used for the antiferromagnetic layer is Pt.

44. An exchange coupling film according to claim 14, wherein the element X' is at least one element selected from the group consisting of Ne, Ar, Kr, Xe, Be, B, C, N, Mg, Al, Si, P, Ti, V, Cr, Fe, Co, Ni, Cu, Zn, Ga, Ge, Zr, Nb, Mo, Ag, Cd, Ir, Sn, Hf, Ta, W, Re, Au, Pb and rare earth elements.

45. An exchange coupling film according to claim 14, wherein the composition ratio (X:Mn) between the element X and Mn is within the range of 4:6 to 6:4.

46. An exchange coupling film according to claim 14, wherein the antiferromagnetic layer is formed of the X—Mn—X' alloy and X' is at least one element selected from the group consisting of Ne, Ar, Kr, Xe, Be, B, C, N, Mg, Al, Si, P, Ti, V, Cr, Fe, Co, Ni, Cu, Zn, Ga, Ge, Zr, Nb, Mo, Ag, Cd, Ir, Sn, Hf, Ta, W, Re, Au, Pb and rare earth elements, said antiferromagnetic layer being formed over the ferromagnetic layer and the composition ratio of X+X' in the X—Mn—X' alloy being within the range of 47 to 57% by atomic ratio.

47. An exchange coupling film according to claim 14, wherein the antiferromagnetic layer is formed of the X—Mn—X' alloy and X' is at least one element selected from the group consisting of Ne, Ar, Kr, Xe, Be, B, C, N, Mg, Al, Si, P, Ti, V, Cr, Fe, Co, Ni, Cu, Zn, Ga, Ge, Zr, Nb, Mo, Ag, Cd, Ir, Sn, Hf, Ta, W, Re, Au, Pb and rare earth elements, said antiferromagnetic layer being formed under the ferromagnetic layer and the composition ratio of X+X' in the X—Mn—X' alloy being within the range of 44 to 57% by atomic ratio.

48. An exchange coupling film according to claim 18, wherein the antiferromagnetic layer is formed of the PtMn alloy, the ratio (c/a) of the lattice constant a to the lattice constant c of said antiferromagnetic layer after the heat treatment being within the range of 0.93 to 0.99.

49. An exchange coupling film according to claim 18, wherein the antiferromagnetic layer is formed of the X—Mn alloy, said antiferromagnetic layer being formed over the ferromagnetic layer with the composition ratio of X in the X—Mn alloy of within the range of 47 to 57% by atomic ratio.

50. An exchange coupling film according to claim 18, wherein the antiferromagnetic layer is formed of the X—Mn alloy, said antiferromagnetic layer being formed under the ferromagnetic layer with the composition ratio of X in the X—Mn alloy of within the range of 44 to 57% by atomic ratio.

51. An exchange coupling film according to claim 19, wherein the element X of the X—Mn—X' alloy to be used for the antiferromagnetic layer is Pt.

52. An exchange coupling film according to claim 19, wherein the element X' is at least one element selected from the group consisting of Ne, Ar, Kr, Xe, Be, B, C, N, Mg, Al, Si, P, Ti, V, Cr, Fe, Co, Ni, Cu, Zn, Ga, Ge, Zr, Nb, Mo, Ag, Cd, Ir, Sn, Hf, Ta, W, Re, Au, Pb and rare earth elements.

53. An exchange coupling film according to claim 19, wherein the composition ratio of X+Mn of the element X and Mn is within the range of 4:6 to 6:4.

54. An exchange coupling film according to claim 19, wherein the antiferromagnetic layer is formed of the X—Mn—X' alloy and X' is at least one element selected from the group consisting of Ne, Ar, Kr, Xe, Be, B, C, N, Mg, Al, Si, P, Ti, V, Cr, Fe, Co, Ni, Cu, Zn, Ga, Ge, Zr, Nb, Mo, Ag, Cd, Ir, Sn, Hf, Ta, W, Re, Au, Pb and rare earth elements, said antiferromagnetic layer being formed over the ferromagnetic layer and the composition ratio of X+X' in the X—Mn—X' alloy being within the range of 47 to 57% by atomic ratio.

55. An exchange coupling film according to claim 19, wherein the antiferromagnetic layer is formed of the X—Mn—X' alloy and X' is at least one element selected from the group consisting of Ne, Ar, Kr, Xe, Be, B, C, N, Mg, Al, Si, P, Ti, V, Cr, Fe, Co, Ni, Cu, Zn, Ga, Ge, Zr, Nb, Mo, Ag, Cd, Ir, Sn, Hf, Ta, W, Re, Au, Pb and rare earth elements, said antiferromagnetic layer being formed under the ferromagnetic layer and the composition ratio of X+X' in the X—Mn—X' alloy being within the range of 44 to 57% by atomic ratio.

56. An exchange coupling film according to claim 21, wherein the composition ratio of X in the X—Mn alloy or the composition ratio of X+X' in the X—Mn—X' alloy is within the range of 50 to 56% by atomic ratio.

57. An exchange coupling film according to claim 22, wherein the composition ratio of X in the X—Mn alloy or the composition ratio of X+X' in the X—Mn—X' alloy is within the range of 46 to 55% by atomic ratio.

58. An exchange coupling film according to claim 23, wherein the element X' is at least one element selected from the group consisting of Ne, Ar, Kr, Xe, Be, B, C, N, Mg, Al, Si, P, Ti, V, Cr, Fe, Co, Ni, Cu, Zn, Ga, Ge, Zr, Nb, Mo, Ag, Cd, Ir, Sn, Hf, Ta, W, Re, Au, Pb and rare earth elements.

59. An exchange coupling film according to claim 23, wherein the composition ratio X:Mn of the element X and Mn is within the range of 4:6 to 6:4.

60. An exchange coupling film according to claim 23, wherein the antiferromagnetic layer is formed of the X—Mn—X' alloy at least one element selected from the group consisting of Ne, Ar, Kr, Xe, Be, B, C, N, Mg, Al, Si, P, Ti, V, Cr, Fe, Co, Ni, Cu, Zn, Ga, Ge, Zr, Nb, Mo, Ag, Cd, Ir, Sn, Hf, Ta, W, Re, Au, Pb and rare earth elements, said antiferromagnetic layer being formed over the ferromagnetic layer and the composition ratio of X+X' in the X—Mn—X' alloy being within the range of 47 to 57% by atomic ratio.

61. An exchange coupling film according to claim 23, wherein the antiferromagnetic layer is formed of the X—Mn—X' alloy at least one element selected from the group consisting of Ne, Ar, Kr, Xe, Be, B, C, N, Mg, Al, Si, P, Ti, V, Cr, Fe, Co, Ni, Cu, Zn, Ga, Ge, Zr, Nb, Mo, Ag, Cd, Ir, Sn, Hf, Ta, W, Re, Au, Pb and rare earth elements, said antiferromagnetic layer being formed under the ferromagnetic layer and the composition ratio of X+X' in the X—Mn—X' alloy being within the range of 44 to 57% by atomic ratio.

62. An exchange coupling film according to claim 24, wherein the composition ratio of the element X' is within the range of 0.2 to 10% by atomic ratio.

63. An exchange coupling film according to claim 26, wherein the composition ratio of X in the X—Mn alloy or the composition ratio of X+X' in the X—Mn—X' alloy is 50 to 56% by atomic ratio.

64. An exchange coupling film according to claim 27, wherein the composition ratio of X in the X—Mn alloy or the composition ratio of X+X' in the X—Mn—X' alloy is 46 to 55% by atomic ratio.

65. An exchange coupling film according to claim 38, wherein the antiferromagnetic layer is formed of the PtMn alloy, the ratio (c/a) of the lattice constant a to the lattice constant c of said antiferromagnetic layer after the heat treatment being within the range of 0.93 to 0.99.

66. An exchange coupling film according to claim 38, wherein the antiferromagnetic layer is formed of the X—Mn alloy, said antiferromagnetic layer being formed over the ferromagnetic layer with the composition ratio of X in the X—Mn alloy of within the range of 47 to 57% by atomic ratio.

67. An exchange coupling film according to claim 38, wherein the antiferromagnetic layer is formed of the X—Mn alloy, said antiferromagnetic layer being formed under the ferromagnetic layer with the composition ratio of X in the X—Mn alloy of within the range of 44 to 57% by atomic ratio.

68. An exchange coupling film according to claim 39, wherein the element X of the X—Mn—X' alloy to be used for the antiferromagnetic layer is Pt.

69. An exchange coupling film according to claim 39, wherein the element X' is at least one element selected from the group consisting of Ne, Ar, Kr, Xe, Be, B, C, N, Mg, Al, Si, P, Ti, V, Cr, Fe, Co, Ni, Cu, Zn, Ga, Ge, Zr, Nb, Mo, Ag, Cd, Ir, Sn, Hf, Ta, W, Re, Au, Pb and rare earth elements.

70. An exchange coupling film according to claim 39, wherein the composition ratio (X:Mn) between the element X and Mn is within the range of 4:6 to 6:4.

71. An exchange coupling film according to claim 39, wherein the antiferromagnetic layer is formed of the X—MnX' alloy and X' is at least one element selected from the group consisting of Ne, Ar, Kr, Xe, Be, B, C, N, Mg, Al, Si, P, Ti, V, Cr, Fe, Co, Ni, Cu, Zn, Ga, Ge, Zr, Nb, Mo, Ag, Cd, Ir, Sn, Hf, Ta, W, Re, Au, Pb and rare earth elements, said antiferromagnetic layer being formed over the ferromagnetic layer and the composition ratio of X+X' in the X—Mn—X' alloy being within the range of 47 to 57% by atomic ratio.

72. An exchange coupling film according to claim 39, wherein the antiferromagnetic layer is formed of the X—Mn—X' alloy and X' is at least one element selected from the group consisting of Ne, Ar, Kr, Xe, Be, B, C, N, Mg, Al, Si, P, Ti, V, Cr, Fe, Co, Ni, Cu, Zn, Ga, Ge, Zr, Nb, Mo, Ag, Cd, Ir, Sn, Hf, Ta, W, Re, Au, Pb and rare earth elements, said antiferromagnetic layer being formed under the ferromagnetic layer and the composition ratio of X+X' in the X—Mn—X' alloy being within the range of 44 to 57% by atomic ratio.

73. An exchange coupling film according to claim 41, wherein the composition ratio of X in the X—Mn alloy or the composition ratio of X+X' in the X—Mn—X' alloy is 50 to 56% by atomic ratio.

74. An exchange coupling film according to claim 42, wherein the composition ratio of X in the X—Mn alloy or the composition ratio of X+X' in the X—Mn—X' alloy is 46 to 55% by atomic ratio.

75. An exchange coupling film according to claim 43, wherein the element X' is at least one element selected from the group consisting of Ne, Ar, Kr, Xe, Be, B, C, N, Mg, Al, Si, P, Ti, V, Cr, Fe, Co, Ni, Cu, Zn, Ga, Ge, Zr, Nb, Mo, Ag, Cd, Ir, Sn, Hf, Ta, W, Re, Au, Pb and rare earth elements.

76. An exchange coupling film according to claim 43, wherein the composition ratio (X:Mn) between the element X and Mn is within the range of 4:6 to 6:4.

77. An exchange coupling film according to claim 43, wherein the antiferromagnetic layer is formed of the X—Mn—X' alloy at least one element selected from the group consisting of Ne, Ar, Kr, Xe, Be, B, C, N, Mg, Al, Si, P, Ti, V, Cr, Fe, Co, Ni, Cu, Zn, Ga, Ge, Zr, Nb, Mo, Ag, Cd, Ir, Sn, Hf, Ta, W, Re, Au, Pb and rare earth elements, said antiferromagnetic layer being formed over the ferromagnetic layer and the composition ratio of X+X' in the X—Mn—X' alloy being within the range of 47 to 57% by atomic ratio.

78. An exchange coupling film according to claim 43, wherein the antiferromagnetic layer is formed of the X—Mn—X' alloy and X' is at least one element selected from the group consisting of Ne, Ar, Kr, Xe, Be, B, C, N, Mg, Al, Si, P, Ti, V, Cr, Fe, Co, Ni, Cu, Zn, Ga, Ge, Zr, Nb, Mo, Ag, Cd, Ir, Sn, Hf, Ta, W, Re, Au, Pb and rare earth elements, said antiferromagnetic layer being formed under the ferromagnetic layer and the composition ratio of X+X' in the X—Mn—X' alloy being within the range of 47 to 57% by atomic ratio.

79. An exchange coupling film according to claim 44, wherein the composition ratio of the element X' is within the range of 0.2 to 10% by atomic ratio.

80. An exchange coupling film according to claim 46, wherein the composition ratio of X in the X—Mn alloy or the composition ratio of X+X' in the X—Mn—X' alloy is 50 to 56% by atomic ratio.

81. An exchange coupling film according to claim 47, wherein the composition ratio of X in the X—Mn alloy or the composition ratio of X+X' in the X—Mn—X' alloy is 46 to 55% by atomic ratio.

82. An exchange coupling film according to claim 49, wherein the composition ratio of X in the X—Mn alloy or the composition ratio of X+X' in the X—Mn—X' alloy is 50 to 56% by atomic ratio.

83. An exchange coupling film according to claim 50, wherein the composition ratio of X in the X—Mn alloy or the composition ratio of X+X' in the X—Mn—X' alloy is 46 to 55% by atomic ratio.

84. An exchange coupling film according to claim 51, wherein the element X' is at least one element selected from the group consisting of Ne, Ar, Kr, Xe, Be, B, C, N, Mg, Al, Si, P, Ti, V, Cr, Fe, Co, Ni, Cu, Zn, Ga, Ge, Zr, Nb, Mo, Ag, Cd, Ir, Sn, Hf, Ta, W, Re, Au, Pb and rare earth elements.

85. An exchange coupling film according to claim 51, wherein the composition ratio (X:Mn) between the element X and Mn is within the range of 4:6 to 6:4.

86. An exchange coupling film according to claim 51, wherein the antiferromagnetic layer is formed of the X—Mn—X' alloy at least one element selected from the group consisting of Ne, Ar, Kr, Xe, Be, B, C, N, Mg, Al, Si, P, Ti, V, Cr, Fe, Co, Ni, Cu, Zn, Ga, Ge, Zr, Nb, Mo, Ag, Cd, Ir, Sn, Hf, Ta, W, Re, Au, Pb and rare earth elements, said antiferromagnetic layer being formed over the ferromagnetic layer and the composition ratio of X+X' in the X—Mn—X' alloy being within the range of 47 to 57% by atomic ratio.

87. An exchange coupling film according to claim 51, wherein the antiferromagnetic layer is formed of the X—Mn—X' alloy and X' is at least one element selected from the group consisting of Ne, Ar, Kr, Xe, Be, B, C, N, Mg, Al, Si, P, Ti, V, Cr, Fe, Co, Ni, Cu, Zn, Ga, Ge, Zr, Nb, Mo, Ag, Cd, Ir, Sn, Hf, Ta, W, Re, Au, Pb and rare earth elements, said antiferromagnetic layer being formed under the ferromagnetic layer and the composition ratio of X+X' in the X—Mn—X' alloy being within the range of 44 to 57% by atomic ratio.

88. An exchange coupling film according to claim 52, wherein the composition ratio of the element X' is within the range of 0.2 to 10% by atonic ratio.

89. An exchange coupling film according to claim 54, wherein the composition ratio of X in the X—Mn alloy or the composition ratio of X+X' in the X—Mn—X' alloy is 50 to 56% by atomic ratio.

90. An exchange coupling film according to claim 55, wherein the composition ratio of X in the X—Mn alloy or the composition ratio of X+X' in the X—Mn—X' alloy is 46 to 55% by atomic ratio.

91. An exchange coupling film according to claim 58, wherein the composition ratio of the element X' is within the range of 0.2 to 10% by atonic ratio.

92. An exchange coupling film according to claim 66, wherein the composition ratio of X in the X—Mn alloy or the composition ratio of X+X' in the X—Mn—X' alloy is 50 to 56% by atomic ratio.

93. An exchange coupling film according to claim 67, wherein the composition ratio of X in the X—Mn alloy or the composition ratio of X+X' in the X—Mn—X' alloy is 46 to 55% by atomic ratio.

94. An exchange coupling film according to claim 68, wherein X' is at least one element selected from the group consisting of Ne, Ar, Kr, Xe, Be, B, C, N, Mg, Al, Si, P, Ti, V, Cr, Fe, Co, Ni, Cu, Zn, Ga, Ge, Zr, Nb, Mo, Ag, Cd, Ir, Sn, Hf, Ta, W, Re, Au, Pb and rare earth elements.

95. An exchange coupling film according to claim 68, wherein the composition ratio (X:Mn) of the element X and Mn is within the range of 4:6 to 6:4.

96. An exchange coupling film according to claim 68, wherein the antiferromagnetic layer is formed of the X—Mn—X' alloy and X' is at least one element selected from the group consisting of Ne, Ar, Kr, Xe, Be, B, C, N, Mg, Al, Si, P, Ti, V, Cr, Fe, Co, Ni, Cu, Zn, Ga, Ge, Zr, Nb, Mo, Ag, Cd, Ir, Sn, Hf, Ta, W, Re, Au, Pb and rare earth elements, said antiferromagnetic layer being formed over the ferromagnetic layer and the composition ratio of X+X' in the X—Mn—X' alloy being within the range of 47 to 57% by atomic ratio.

97. An exchange coupling film according to claim 68, wherein the antiferromagnetic layer is formed of the X—Mn—X' alloy and X' is at least one element selected from the group consisting of Ne, Ar, Kr, Xe, Be, B, C, N, Mg, Al, Si, P, Ti, V, Cr, Fe, Co, Ni, Cu, Zn, Ga, Ge, Zr, Nb, Mo, Ag, Cd, Ir, Sn, Hf, Ta, W, Re, Au, Pb and rare earth elements, said antiferromagnetic layer being formed under the ferromagnetic layer and the composition ratio of X+X' in the X—Mn—X' alloy being within the range of 44 to 57% by atomic ratio.

98. An exchange coupling film according to claim 69, wherein the composition ratio of the element X' is within the range of 0.2 to 10% by atomic ratio.

99. An exchange coupling film according to claim 71, wherein the composition ratio of X in the X—Mn alloy or the composition ratio of X+X' in the X—Mn—X' alloy is 50 to 56% by atomic ratio.

100. An exchange coupling film according to claim 72, wherein the composition ratio of X+X' in the X—Mn—X' alloy is 46 to 55% by atomic ratio.

101. An exchange coupling film according to claim 75, wherein the composition ratio of the element X' is within the range of 0.2 to 10% by atonic ratio.

102. An exchange coupling film according to claim 84, wherein the composition ratio of the element X' is within the range of 0.2 to 10% by atomic ratio.

103. An exchange coupling film according to claim 94, wherein the composition ratio of the element X' is within the range of 0.2 to 10% by atomic ratio.

* * * * *